US011262813B2

(12) United States Patent
Tsorng et al.

(10) Patent No.: US 11,262,813 B2
(45) Date of Patent: Mar. 1, 2022

(54) DOUBLE-SIDED AND TOOL-LESS M.2 MODULE DESIGN

(71) Applicant: Quanta Computer Inc., Taoyuan (TW)

(72) Inventors: Yaw-Tzorng Tsorng, Taoyuan (TW);
Chun Chang, Taoyuan (TW);
Yu-Syuan Lin, Taoyuan (TW);
Ting-Kuang Pao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 85 days.

(21) Appl. No.: 15/929,481

(22) Filed: May 5, 2020

(65) Prior Publication Data

US 2021/0349504 A1    Nov. 11, 2021

(51) Int. Cl.
| | |
|---|---|
| *G06F 1/18* | (2006.01) |
| *H05K 1/14* | (2006.01) |
| *H05K 1/18* | (2006.01) |
| *H01R 12/70* | (2011.01) |
| *H01R 12/73* | (2011.01) |

(52) U.S. Cl.
CPC .............. *G06F 1/187* (2013.01); *G06F 1/185* (2013.01); *G06F 1/186* (2013.01); *H05K 1/141* (2013.01); *H05K 1/181* (2013.01); *H01R 12/7005* (2013.01); *H01R 12/73* (2013.01); *H05K 2201/042* (2013.01); *H05K 2201/10409* (2013.01); *H05K 2201/10598* (2013.01)

(58) Field of Classification Search
CPC ........ F16B 37/043; G06F 1/185; G06F 1/186; G06F 1/187; G06F 1/184; G06F 1/183; G06F 13/409; H05K 2201/10409; H05K 2201/10393; H05K 2201/10386; H05K 2201/10378; H05K 7/1417; H05K 5/0013; H05K 7/1401; H05K 7/1402; H05K 7/1404; H05K 7/1405; H05K 7/1407; H05K 7/1408; H05K 7/1409; H05K 7/1418; H05K 1/141; H05K 1/181; H05K 2201/042; H05K 2201/10598; H01R 12/7005; H01R 12/73
See application file for complete search history.

(56) References Cited

U.S. PATENT DOCUMENTS

| | | | | |
|---|---|---|---|---|
| 6,295,701 | B1 * | 10/2001 | Bessho | H05K 5/0013 24/297 |
| 9,520,658 | B1 * | 12/2016 | Schmit | H01R 4/302 |
| 9,703,331 | B1 * | 7/2017 | Chien | G06F 1/187 |
| 9,778,708 | B1 * | 10/2017 | Meserth | G06F 1/185 |
| 10,008,791 | B1 * | 6/2018 | Masumoto | H01R 12/7047 |
| 10,082,842 | B1 * | 9/2018 | Looi | G06F 1/185 |

(Continued)

*Primary Examiner* — Michael A Matey
(74) *Attorney, Agent, or Firm* — Nixon Peabody LLP

(57) ABSTRACT

An M.2 fastening system has an M.2 riser card with two module-receiving sides and a plurality of adjustment positions. The M.2 fastening system further has a pair of M.2 fasteners mounted respectively on the module-receiving sides. Each M.2 fastener has a main body defined by a top surface and a bottom surface; a module attachment extending from the top surface; and a hook extending from the bottom surface along a lateral side of the main body. The hook of one of the M.2 fasteners is received through an attachment aperture of an adjustment position. The hook is pressed-fit over the top surface of the main body of another M.2 fastener. The hook secures the M.2 riser card between the pair of M.2 fasteners in a tool-less manner.

20 Claims, 23 Drawing Sheets

(56) References Cited

U.S. PATENT DOCUMENTS

| | | | | |
|---|---|---|---|---|
| 10,101,523 | B1* | 10/2018 | Lai | G02B 6/0091 |
| 10,103,466 | B1* | 10/2018 | Sporer | H05K 1/141 |
| 10,465,735 | B1* | 11/2019 | Hsieh | H05K 7/12 |
| 10,645,794 | B1* | 5/2020 | Chien | H05K 7/10 |
| 2016/0029478 | A1* | 1/2016 | Bayerer | H05K 1/0256 |
| | | | | 361/736 |
| 2016/0249455 | A1* | 8/2016 | Yang | F16B 5/0642 |
| 2017/0345803 | A1* | 11/2017 | Tate | H05K 1/141 |
| 2017/0371383 | A1* | 12/2017 | Yang | F16B 33/002 |
| 2018/0138612 | A1* | 5/2018 | Lin | H01R 13/64 |
| 2018/0203490 | A1* | 7/2018 | Kim | H05K 1/0209 |
| 2018/0323597 | A1* | 11/2018 | Joubeaux | F16B 5/0628 |
| 2019/0074614 | A1* | 3/2019 | Chen | G06F 1/187 |
| 2019/0174618 | A1* | 6/2019 | Chen | H05K 1/0269 |
| 2020/0200216 | A1* | 6/2020 | Wang | F16C 29/001 |
| 2020/0389975 | A1* | 12/2020 | Lai | H05K 1/141 |
| 2021/0064102 | A1* | 3/2021 | Tseng | F16B 2/18 |
| 2021/0140456 | A1* | 5/2021 | Zimmermann | B62J 15/02 |

* cited by examiner

DOUBLE-SIDED AND TOOL-LESS M.2 MODULE DESIGN

FIELD OF THE INVENTION

The present invention relates generally to a server system, and more specifically, to an M.2 flexible system for fastening M.2 modules to a printed circuit board ("PCB").

BACKGROUND OF THE INVENTION

M.2 is a specification standard for internally mounted computer expansion cards and associated connectors. The M.2 standard employs a more flexible physical specification than other standards, such as the mSATA standard. Specifically, the M.2 standard accommodates installation of M.2 modules to a PCB when the M.2 modules have different module widths and lengths. Thus, with flexible expansion interfaces, M.2 modules are increasingly becoming more important in server computer system.

Present M.2 modules are coupled to a PCB via an M.2 single-sided mount design or an M.2 double-sided mount design. M.2 single-sided mount design is generally inefficient because common plastic components occupy a relatively large space on a main PCB. Thus, instead of the M.2 single-sided mount design, the M.2 double-sided mount design is generally used for a relatively increased efficiency of the space on the main PCB.

However, current M.2 double-sided mount designs are disadvantageous for a number of reasons. For example, current M.2 double-sided mount designs require tools for securing an M.2 nut to an M.2 riser card. The tool requirement adds unnecessary complexity, including increased time and expenses, to the mounting and/or service process. The tool requirement also increases the risk of damage to the PCB.

The present disclosure is directed to an M.2 fastening system that solves the above problems and other needs.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, an M.2 fastening system is configured for mounting an M.2 module to a printed circuit board (PCB). The M.2 fastening system includes an M.2 riser card having an M.2 first module-receiving side and an M.2 second module-receiving side. The M.2 riser card further has a plurality of adjustment positions positioned at respective distances from a distal end. Each of the plurality of adjustment positions includes a first attachment aperture and a second attachment aperture. The M.2 fastening system further includes a pair of M.2 fasteners, which include an M.2 first fastener and an M.2 second fastener. The M.2 first fastener is mounted on the M.2 first module-receiving side, and the M.2 second fastener is mounted on the M.2 second module-receiving side. Each M.2 fastener of the pair of M.2 fasteners has a main body defined by a top surface and a bottom surface. Each M.2 fastener further has a module attachment that extends from the top surface, for fixing the M.2 module to the M.2 riser card. Each M.2 fastener further has a hook extending from the bottom surface along a lateral side of the main body. The hook of the M.2 first fastener is received through the first attachment aperture, and is pressed-fit over the top surface of the main body of the M.2 second fastener. The hook of the M.2 first fastener secures the M.2 riser card between the M.2 first fastener and the M.2 second fastener in a tool-less manner.

According to an implementation of the above aspect, the hook of the M.2 second fastener is received through the second attachment aperture, and is pressed-fit over the top surface of the main body of the M.2 first fastener. The hook of the M.2 second fastener further secures the M.2 first fastener and the M.2 second fastener to each other and to the M.2 riser card.

According to another implementation of the above aspect, each of the pair of M.2 fasteners further has a locating ridge that extends from the bottom surface of the main body.

According to a configuration of the above implementation, each of the plurality of adjustment positions further includes a locating aperture positioned between the first attachment aperture and the second attachment aperture. The locating ridge are received within the locating aperture.

According to a more specific configuration of the above configuration, the locating ridge has a mating size and shape to the locating aperture.

According to yet another implementation of the above aspect, the module attachment has a cylindrical shape.

According to yet another implementation of the above aspect, the module attachment has an internal threaded nut for receiving a screw. The internal threaded nut secures the M.2 module to the M.2 riser card with the screw.

According to yet another implementation of the above aspect, the module attachment extends in the form of support rib with a disk-shaped end. The disk-shaped end secures the M.2 module to the M.2 riser card with a press-fit connection.

According to yet another implementation of the above aspect, the module attachment includes a hollow cylinder and a rotational element. The rotational element has a rod with an inserted end rotatably fixed within the hollow cylinder. The rotational element further has a latch generally perpendicular to the rod at an attachment end. The latch secures the M.2 module to the M.2 riser card.

According to yet another implementation of the above aspect, at least one of the pair of M.2 fasteners consists of a plastic material.

According to yet another implementation of the above aspect, the M.2 first fastener is identical to the M.2 second fastener.

According to yet another implementation of the above aspect, the plurality of adjustment positions includes a first position, a second position, and a third position.

According to a configuration of the above implementation, the first position is at a distance of approximately 60 millimeters (mm) from the distal end; the second position is at a distance of approximately 80 millimeters (mm) from the distal end; and the third position is at a distance of approximately 110 millimeters (mm) from the distal end.

According to another aspect of the present disclosure, a method is directed to the assembly of an M.2 fastening system. The method includes providing an M.2 riser card having an M.2 first module-receiving side and an M.2 second module-receiving side. The M.2 riser card further has a plurality of adjustment positions positioned at respective distances from a distal end. Each of the plurality of adjustment positions includes a first attachment aperture and a second attachment aperture. The plurality of adjustment positions includes at least a first adjustment position and a second adjustment position. The method further includes positioning an M.2 first fastener on the M.2 first module-receiving side. The M.2 first fastener has a first hook inserted through the first attachment aperture of the first adjustment position. The M.2 first fastener has a first main body with a first bottom surface that is in contact with the M.2 first module-receiving side. The method further includes positioning an M.2 second fastener on the M.2 second module-receiving side. The M.2 second fastener has a second hook inserted through the second attachment aperture of the first adjustment position. The M.2 second fastener has a second main body with a second bottom surface that is in contact with the M.2 second module-receiving side. The method further includes securing via a press-fit, tool-less connection the first hook to the second main body and the second hook to the first main body. The securing mounts the M.2 riser card between the M.2 first fastener and the M.2 second fastener.

According to an implementation of the above aspect, the method further includes mounting an M.2 first module to a first module attachment of the M.2 first fastener. The first module attachment extends from a first top surface of the first main body. The method also includes mounting an M.2 second module to a second module attachment of the M.2 second fastener. The second module attachment extends from a second top surface of the second main body.

According to a configuration of the above implementation, the mounting of the M.2 first module and the M.2 second module is achieved via: (a) a nut connection; (b) a press-fit connection; or (c) a rotational latch connection.

According to another implementation of the above aspect, the method further includes moving the M.2 first fastener and the M.2 second fastener to the second adjustment position.

According to yet another aspect of the present disclosure, an M.2 fastening system is configured for mounting an M.2 module to a printed circuit board (PCB). The M.2 fastening system includes an M.2 riser card having an M.2 first module-receiving side and an M.2 second module-receiving side. The M.2 riser card further has a first attachment aperture and a second attachment aperture. The M.2 fastening system further includes an M.2 first fastener mounted on the M.2 first module-receiving side. The M.2 first fastener has a first main body defined by a first top surface and a first bottom surface, and a first module attachment extending from the first top surface. The M.2 first fastener further has a first hook extending from the first bottom surface along a first lateral side of the first main body. The first hook is received through the first attachment aperture. The M.2 fastening system also includes an M.2 second fastener mounted on the M.2 second module-receiving side. The M.2 second fastener has a second main body defined by a second top surface and a second bottom surface. The first hook is pressed-fit, in a tool-less manner, over the second top surface. The M.2 second fastener has a second module attachment extending from the second top surface, and a second hook extending from the second bottom surface along a second lateral side of the second main body. The second hook is received through the second attachment aperture, and is pressed-fit, in a tool-less manner, over the first top surface.

According to an implementation of the above aspect, the M.2 first fastener and the M.2 second fastener are identical to each other.

According to another implementation of the above aspect, at least one of the first module attachment and the second module attachment includes: (a) a nut connection; (b) a press-fit connection; or (c) a rotational latch connection.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
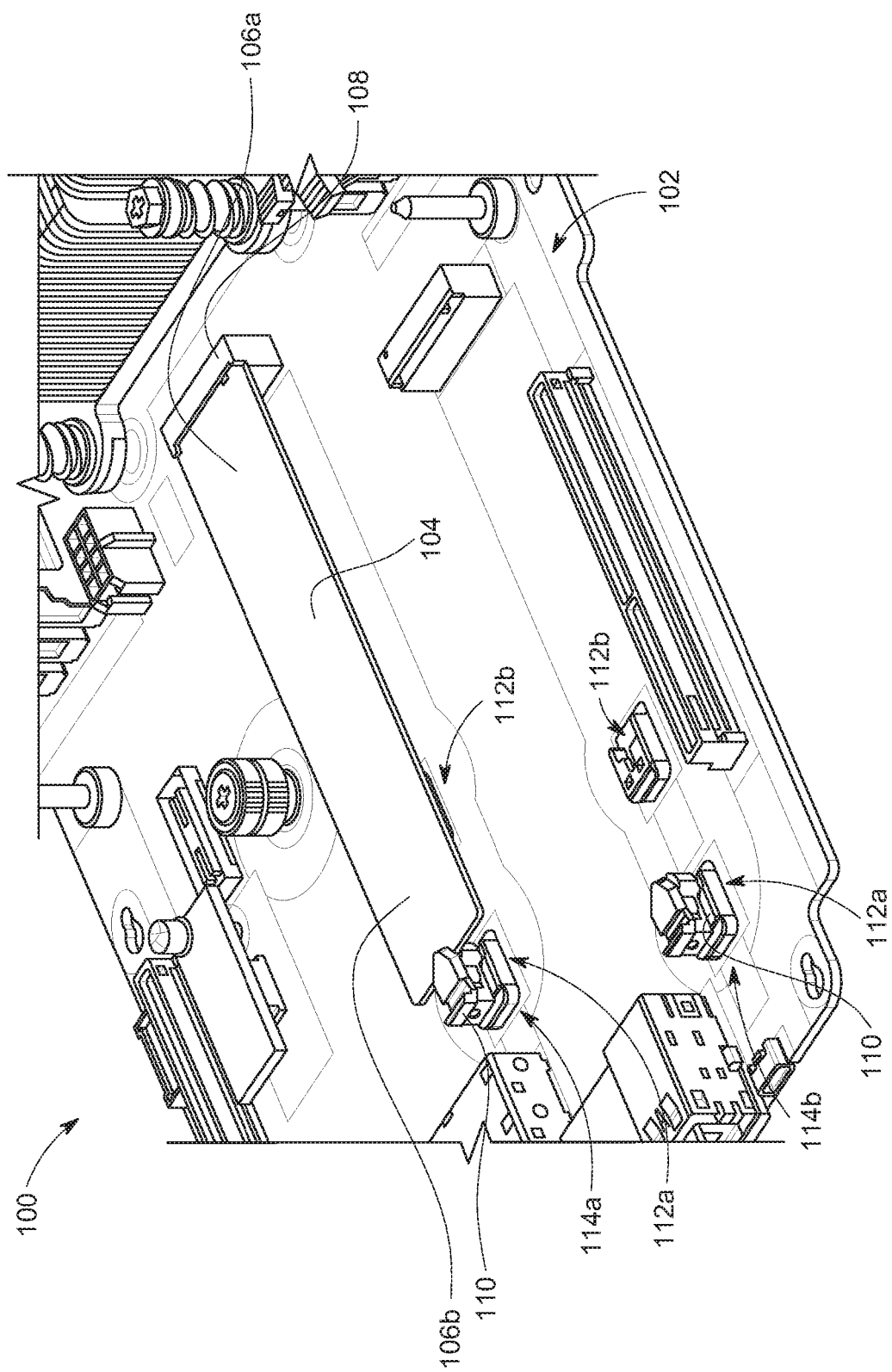
FIG. 1 is a perspective view illustrating a single-sided mount design, according to one type of prior design.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Referring to FIG. 1, according to one type of prior design, a printed circuit board assembly ("PCBA") 100 includes a PCB 102 on which electronic and other components are mounted. An M.2 module 104 has a distal end 106a that is secured to the PCB 102 via a module interface 108. The M.2 module 104 also has a proximal end 106b that is secured to the PCB 102 via an M.2 plastic latch 110. The M.2 plastic latch 110 is fixed to the PCB 102 in a first adjustment position 112a, which according to the illustrated embodiment accommodates an M.2 module length of 110 millimeters (mm).

The PCB 102 includes a second adjustment position 112b, which is another one of a plurality of adjustment positions. The first and second adjustment positions 112a, 112b are located in a first module position 114a. The PCB 102 has a second module position 114b, which has respective first and second adjustment positions 112a, 112b for receiving a respective M.2 plastic latch 110.

Figure 2:
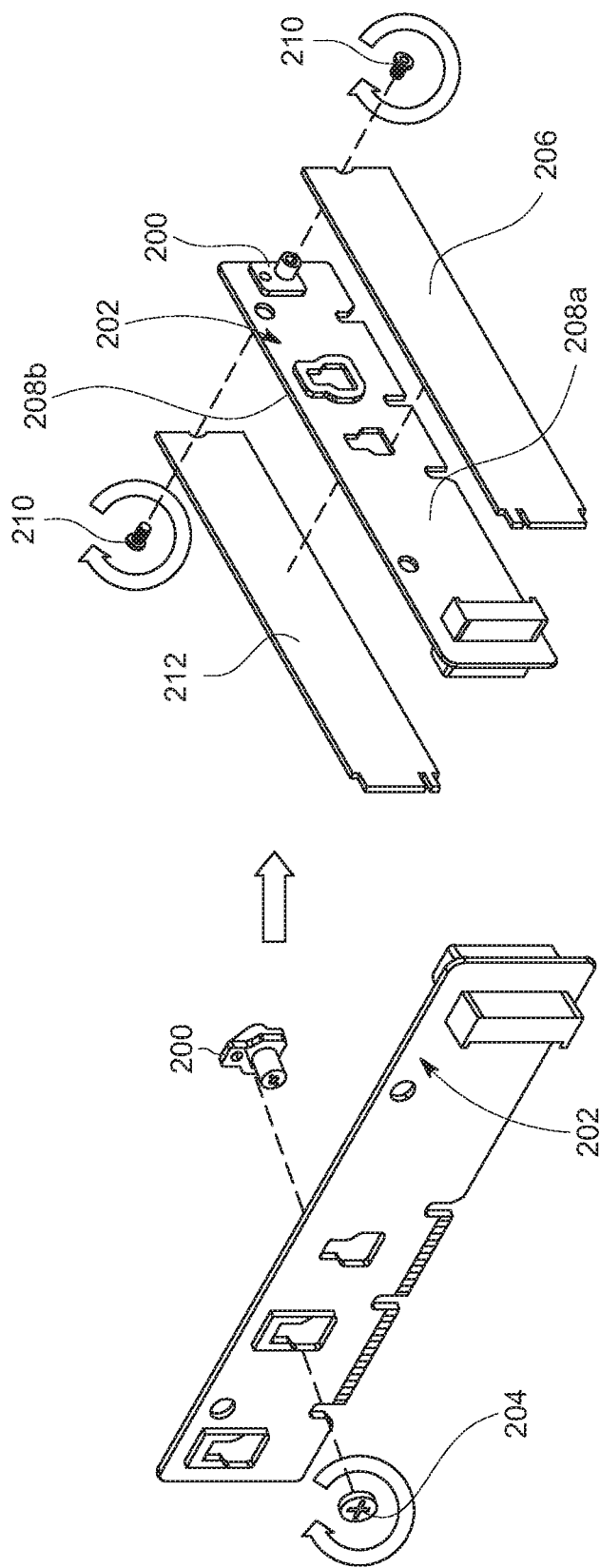
FIG. 2 is a perspective view illustrating assembly of a M.2 module to an M.2 riser card, according to another type of prior design.

Referring to FIG. 2, according to a double-sided prior design, an M.2 nut 200 is fixed to an M.2 riser card 202. Specifically, a riser screw 204 is fastened to the M.2 nut 200 using a tool, such as a screwdriver. The M.2 riser card 202 is fixed between the M.2 nut 200 and the riser screw 204.

Then, an M.2 first module 206 is fixed to the M.2 nut 200 on a first side 208a of the M.2 riser card 202. Specifically, a module screw 210 is fastened to the M.2 nut 200 using the same or another tool. The M.2 first module 206 is fixed between the M.2 nut 200 and the module screw 210.

An M.2 second module 212 is further fixed to the M.2 nut 200 on a second side 208b of the M.2 riser card 202. Specifically, another module screw 210 is fastened to the M.2 nut 200 using the same or another tool. The M.2 second module 212 is fixed between the M.2 nut 200 and the respective module screw 206. Thus, the M.2 nut 200 and the M.2 riser card 202 accommodate a double-sided mount system for receiving, on respective sides 208a, 208b, both the M.2 first module 206 and the M.2 second module 212.

Both prior designs that are illustrated in FIGS. 1 and 2 are disadvantageous and problematic. For example, both designs require tools to assemble and/or service the M.2 modules 206, 212. Additionally, in another example, both prior designs require a ground pad for protecting the PCBA 100 from electromagnetic interference. As such, time and cost with the assembly and/or servicing of the M.2 modules 206, 212 is unnecessarily increased.

Figure 3:
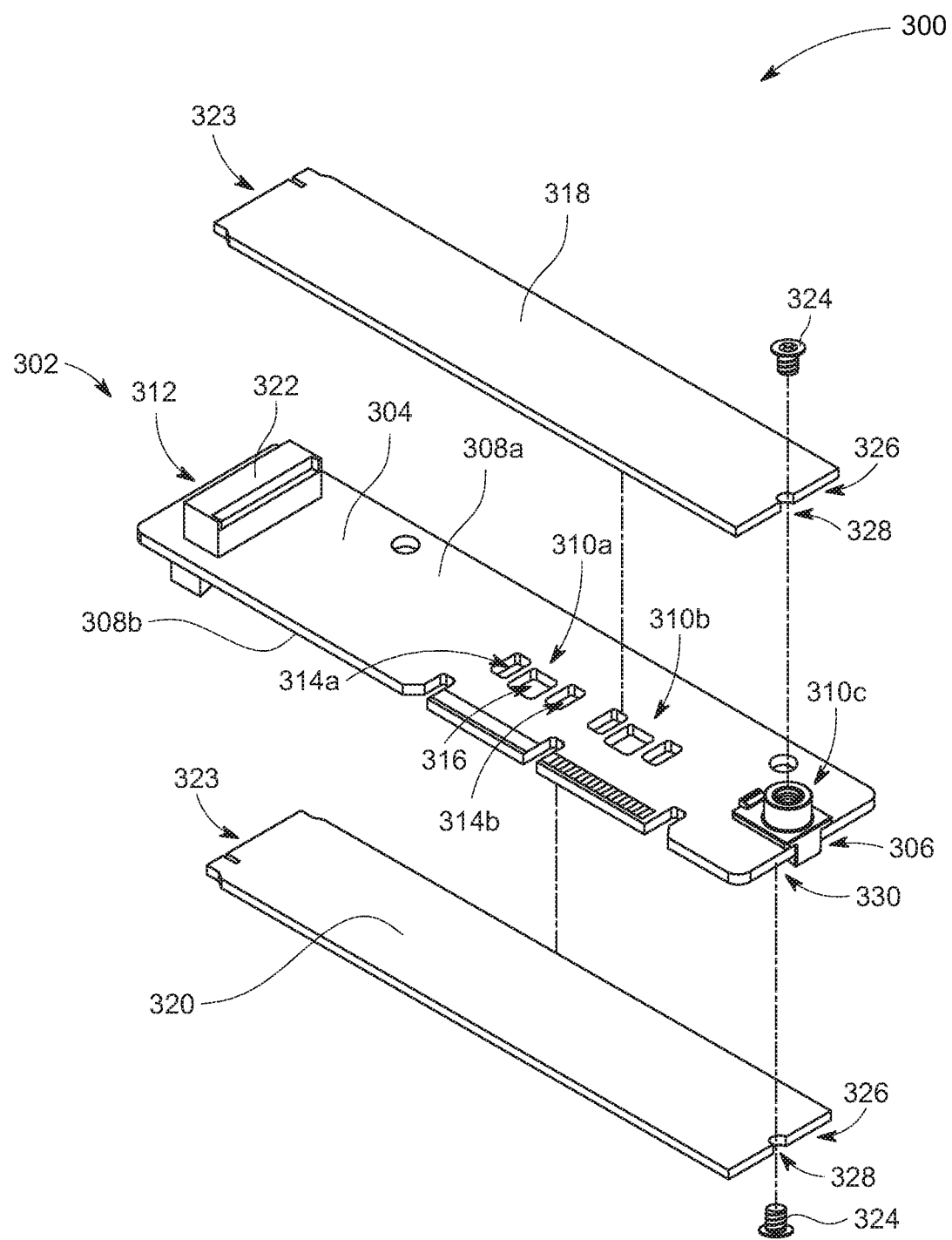
FIG. 3 is a perspective exploded view illustrating an M.2 assembly, in accordance with one implementation of the present disclosure.

Referring to FIG. 3, an M.2 assembly 300 includes an M.2 fastening system 302, which includes an M.2 riser card 304 and a pair of M.2 fasteners 306. The M.2 riser card 304 has an M.2 first module-receiving side 308a and an M.2 second module-receiving side 308b.

The M.2 riser card 304 further has a plurality of adjustment positions 310a-310c that are positioned at respective distances X1-X3 from a distal end 312. Each adjustment position 310a-310c includes a first attachment aperture 314a and a second attachment aperture 314b. The first and second attachment apertures 314a, 314b are separated by a locating aperture 316.

The M.2 assembly 300 further includes an M.2 first module 318 and an M.2 second module 320. The M.2 first module 318 is fixable on the M.2 first module-receiving side 308a. The M.2 second module 320 is fixable on the M.2 second module-receiving side 308b. Each M.2 module 318, 320 is fixable between a module interface 322 and a respective one of the pair of M.2 fasteners 306. Specifically, a distal end 323 of each M.2 module 318, 320 is coupled to the module interface 322, which is near the distal end 312 of the M.2 riser card 304. A proximal end 326 of each module 318, 320 is fastened via a riser screw 324 to a respective fastener of the pair of fasteners 306. The riser screw 324 is received within an open aperture 328 of each M.2 module 318, 320, fastening the respective M.2 module 318, 320 to the respective fastener 306.

The pair of M.2 fasteners 306 are mounted in one of the adjustment positions 310a-310c. According to the illustrated example, the pair of M.2 fasteners 306 is mounted to the third position 310c, which is generally near a proximal end 330 of the M.2 riser card 304.

Figure 4:
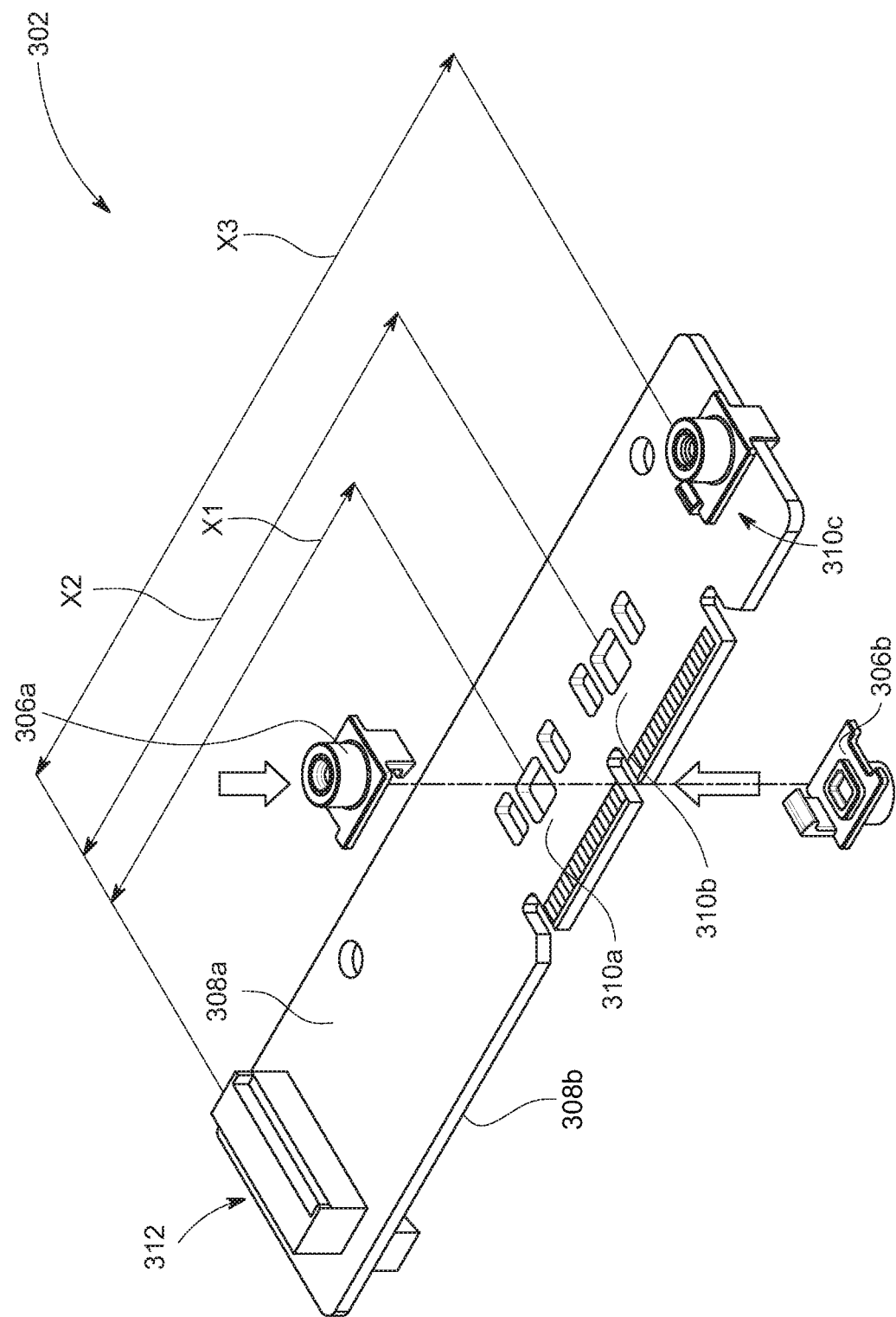
FIG. 4 is a perspective exploded view illustrating an M.2 fastening system, in accordance with the implementation of FIG. 3.

Referring to FIG. 4, the M.2 fastening system 302 includes an M.2 first fastener 306a being mounted on the M.2 first module-receiving side 308a. The M.2 fastening system 302 further includes an M.2 second fastener 306b being mounted on the M.2 second module-receiving side 308b. According to one example, the M.2 first module-receiving side 308a is a top side and the M.2 second module-receiving side 308b is a bottom side. Optionally, one or more of the M.2 fasteners 306a, 306b are made of a plastic material. Optionally yet, the M.2 first fastener 306a is identical to the M.2 second fastener 306b.

The plurality of adjustment positions 310a-310c of the M.2 riser card 304 includes a first position 310a, a second position 310b, and a third position 310c. According to one example, the first position 310a is at a distance X1 from the distal end 312, which is approximately 60 mm from the distal end 312. According to another example, the second position 310b is at a distance X2 from the distal end 312, which is approximately 80 mm from the distal end 312. According to yet another example, the third position 310c is at a distance X3 from the distal end 312, which is approximately 110 mm from the distal end 312.

Figure 5:
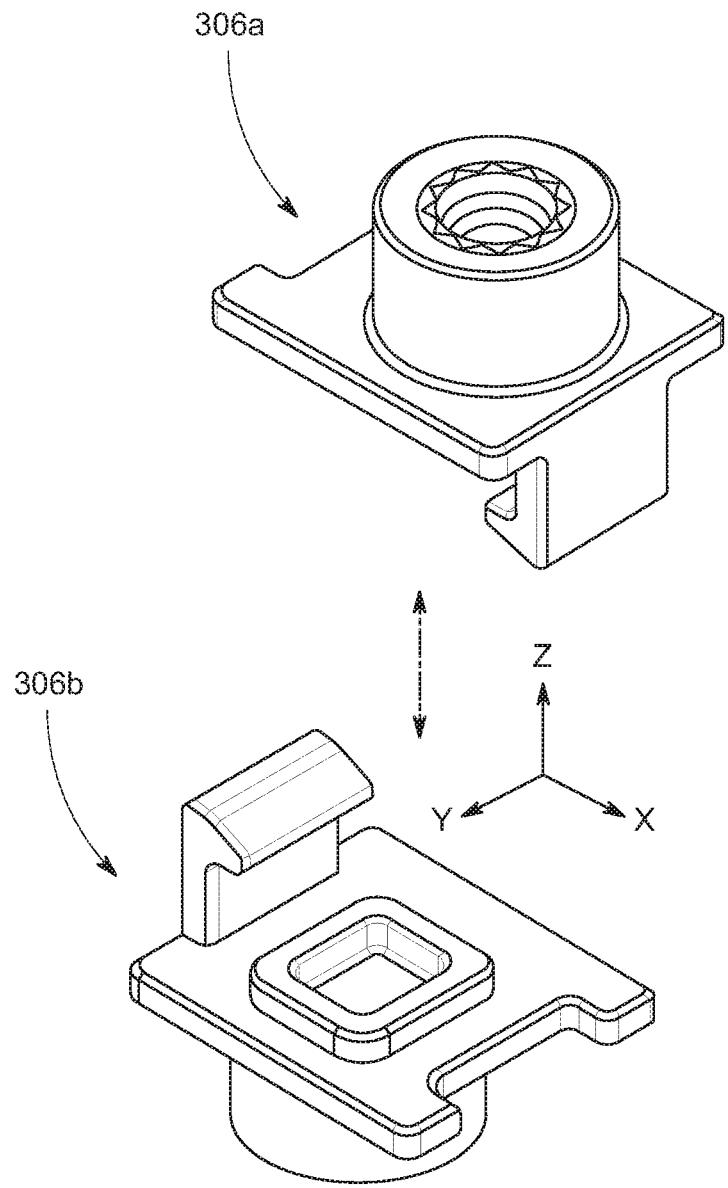
FIG. 5 is a perspective view illustrating a pair of M.2 fasteners, in accordance with the implementation of FIG. 3.

Referring to FIG. 5, the M.2 first fastener 306a is generally identical to the M.2 second fastener 306b. However, when mounted, the M.2 first fastener 306a is in a mirrored position relative to the M.2 second fastener 306b, with respect to a Y-axis of a three-axis coordinate system that includes an X-axis, a Y-axis, and a Z-axis. Thus, upon mounting and together, the M.2 first fastener 306a and the M.2 second fastener 306b provide a symmetrical mounting arrangement.

Figure 6:
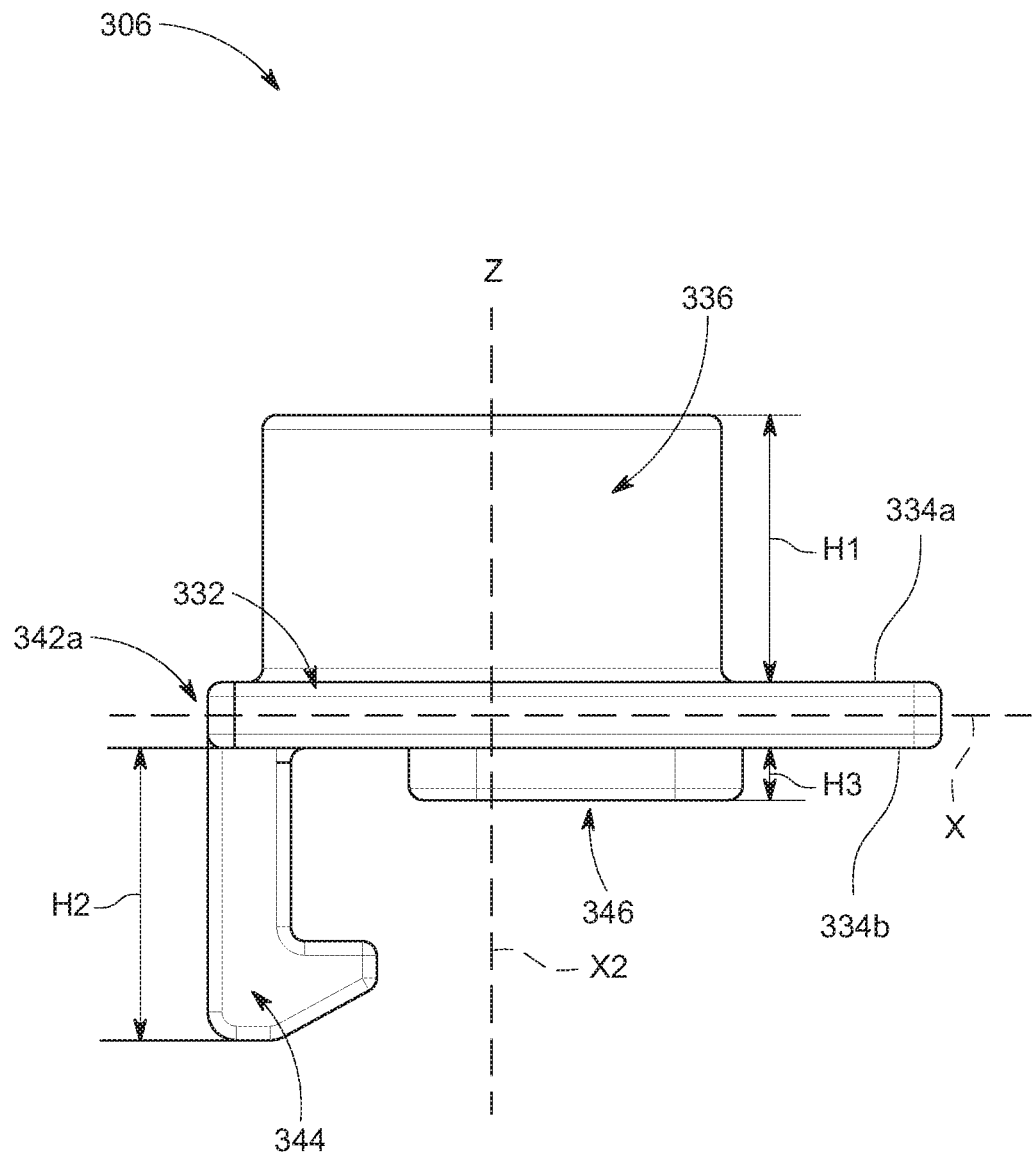
FIG. 6 is a side view of an M.2 fastener, in accordance with the implementation of FIG. 3.
Figure 7:
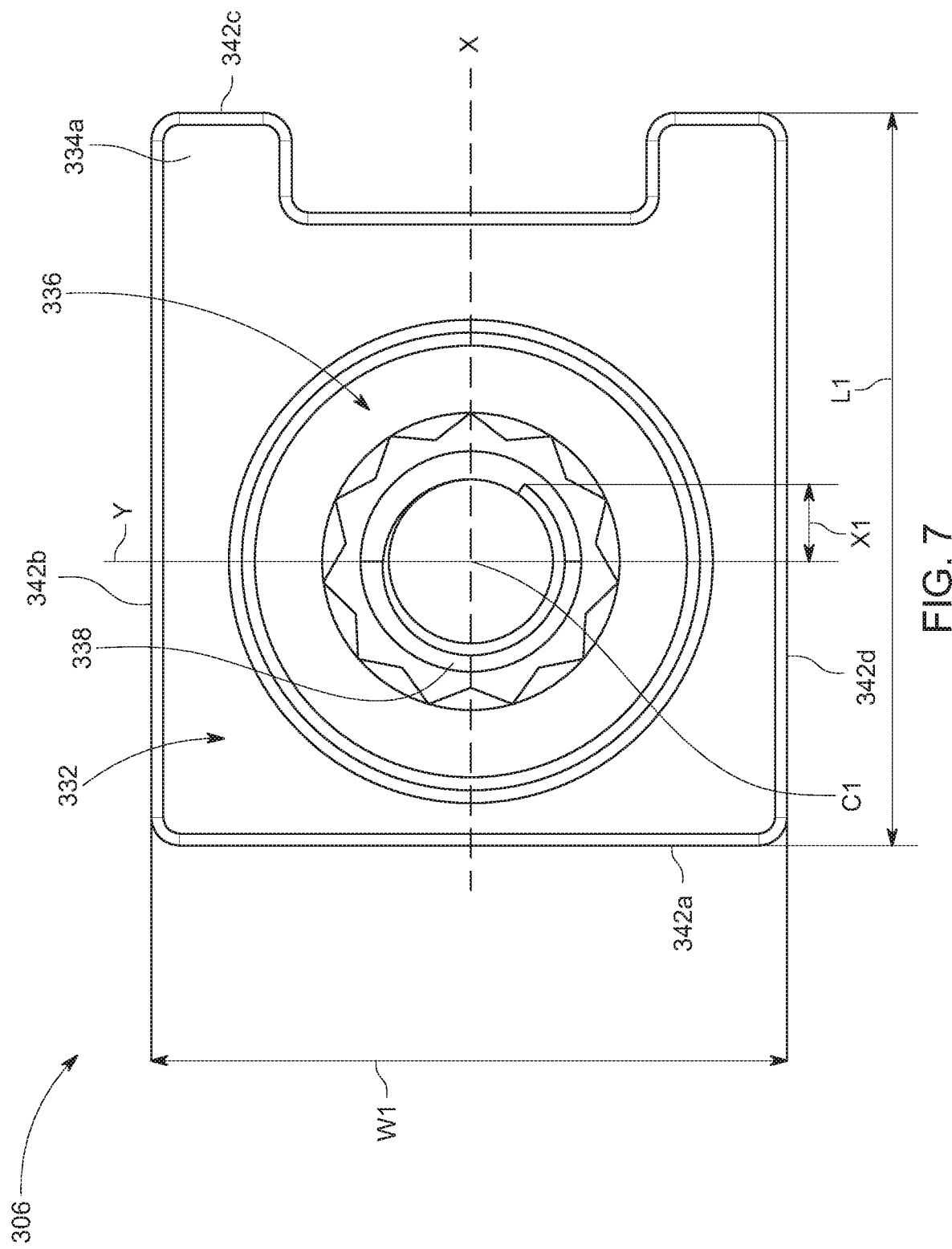
FIG. 7 is a top view of the M.2 fastener of FIG. 6.

Referring initially to FIGS. 6 and 7, each M.2 fastener 306 (identified in FIG. 5 as the M.2 first fastener 306a and the M.2 second fastener 306b) has a main body 332 defined by a top surface 334a and a bottom surface 334b (only shown in FIG. 6). A module attachment 336 extends from the top surface 334a, and is configured to fix a respective one of the M.2 modules 318, 320 to the M.2 riser card 304 (as illustrated in FIG. 3). In the illustrated exemplary embodiment, the module attachment 336 has a generally cylindrical shape, which has optionally a height H1 of 4.0 mm (illustrated only in FIG. 6) that extends along the Z-axis. The module attachment 336 includes an internal threaded nut 338 (illustrated only in FIG. 7) for receiving a respective riser screw 324 (illustrated in FIG. 3), and which secures the respective M.2 module 318, 320 to the M.2 riser card 304 (as further illustrated in FIG. 3).

Referring more specifically to FIG. 7, the main body 332 has a generally rectangular shape defined by a length L1 (along the X-axis) and a width W1 (along the Y-axis). According to one example, the length L is approximately 11.0 mm and the width W is approximately 9.5 mm.

The module attachment 336 is surrounded by peripheral sides of the main body 332, which include a first lateral side 342a, a second lateral side 342b, a third lateral side 342c, and a fourth lateral side 342d. Optionally, the module attachment 336 is symmetrically between some or all of the opposite pairs of lateral sides 342a-342d. For example, as illustrated, the module attachment 336 is symmetrically positioned with respect to the X-axis (between the second and fourth lateral sides 342b, 342d), but is asymmetrically positioned with respect to the Y-axis (between the first and third lateral sides 342a, 342c). With respect to the Y-axis, a center point C1 of the module attachment 336 is offset from the Y-axis by a distance X1.

Figure 8:
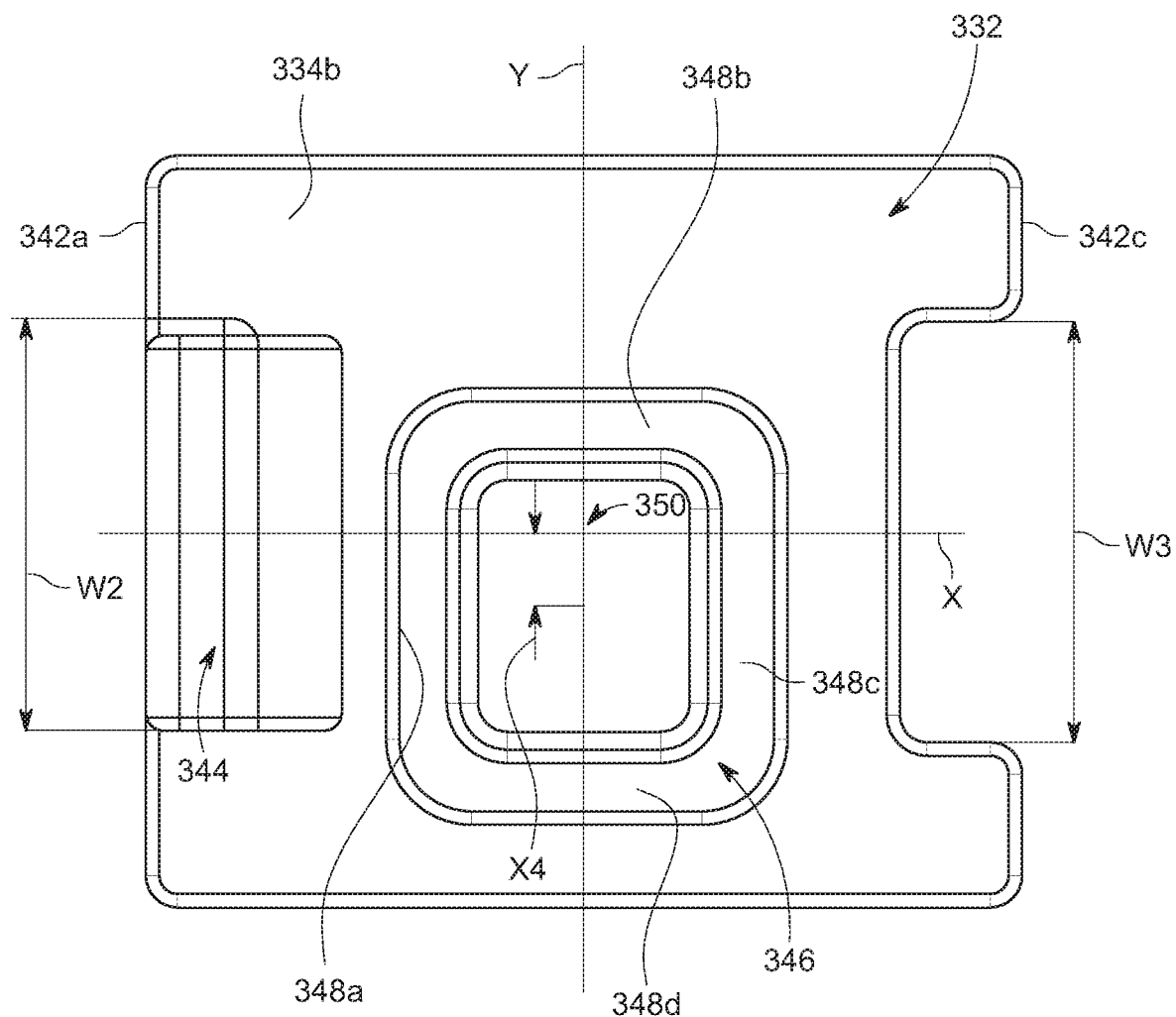
FIG. 8 is a bottom view of the M.2 fastener of FIG. 6.

Referring now to FIGS. 6 and 8, a hook 344 extends from the bottom surface 334b along the first lateral side 342a of the main body 332. Optionally, the hook 344 has a height H2 that is approximately 4.4 mm (illustrated only in FIG. 6) and a width W2 that is approximately 5.0 mm (illustrated only in FIG. 8). According to the illustrated example, the hook 344 is symmetrically positioned along the X axis.

A locating ridge 346 extends from the bottom surface 334b of the main body 332. According to the illustrated example in FIG. 6, the locating ridge 346 has a height H3 of approximately 0.8 mm. The locating ridge 346 has four connecting ridges 348a-348d, which perform a periphery surrounding an internal depression 352 (as shown only in FIG. 8). According to the illustrated example, the locating ridge 346 has a generally square shape with rounded corners.

Optionally, the locating ridge 346 is symmetrically positioned relative to one or more of the X-axis, the Y-axis, or Z-axis. For example, as shown in FIG. 8, the locating ridge 346 is symmetrically positioned relative to the Y-axis. However, according to this example, the locating ridge 346 is asymmetrically positioned relative to the Z-axis (as illustrated in FIG. 6), being offset by a distance X2. The locating ridge 346 is also, optionally, asymmetrically positioned relative to the X-axis (as illustrated in FIG. 8), being offset by a distance X4.

A notch 350 is located along the third lateral side 342c for receiving within a hook 344 from a different M.2 fastener. Thus, the notch 350 is designed with a size and shape that accommodates receiving the respective hook 344 of a different M.2 fastener. The notch 350, according to one exemplary embodiment, has a width W3 that is approximately 5.3 mm, which is slightly larger than the 5.0 mm width W2 of the hook 344.

Figure 9:
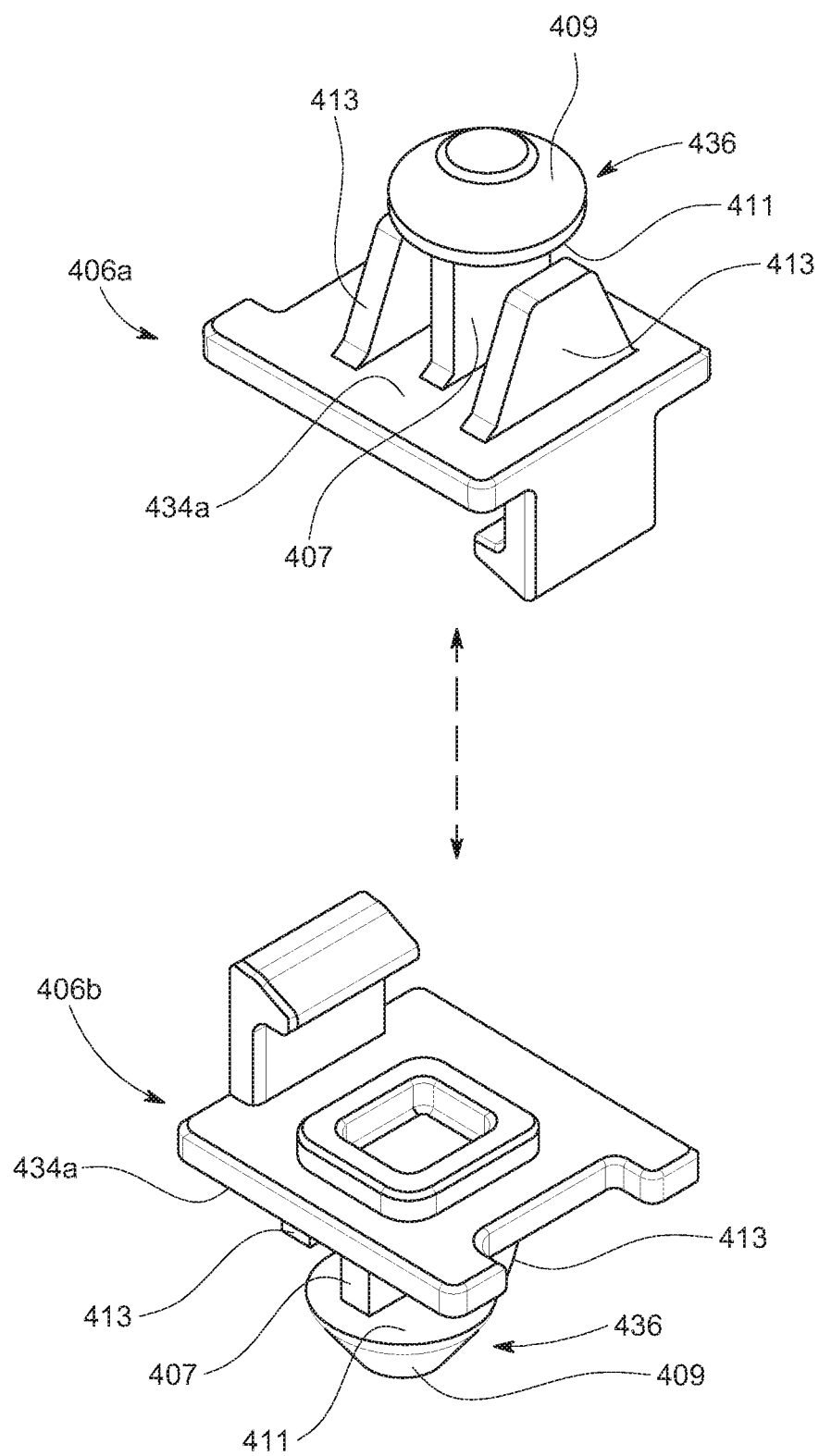
FIG. 9 is a perspective view illustrating a pair of M.2 fasteners, in accordance with another implementation of the present disclosure.

Referring to FIG. 9, a pair of M.2 fasteners 406a, 406b are generally similar to the pair of M.2 fasteners 306a, 306b disclosed above (shown in FIG. 5), except for having a different type of module attachment 436. Specifically, the module attachment 436 extends from a top surface 434a in the form of a support rib 407. The support rib 407 has a disk-shaped end 409 for securing a respective M.2 module 318, 320 (shown in FIG. 3) using a press-fit connection between an interface surface 411 of the disk-shaped end 409 and a respective contacting surface of the M.2 module 318, 320. The module attachment 436 further includes side supports 413 that are generally parallel to the support rib 407. The side supports 413 provide additional rigidity to the M.2 fasteners 406a, 406b.

Figure 10:
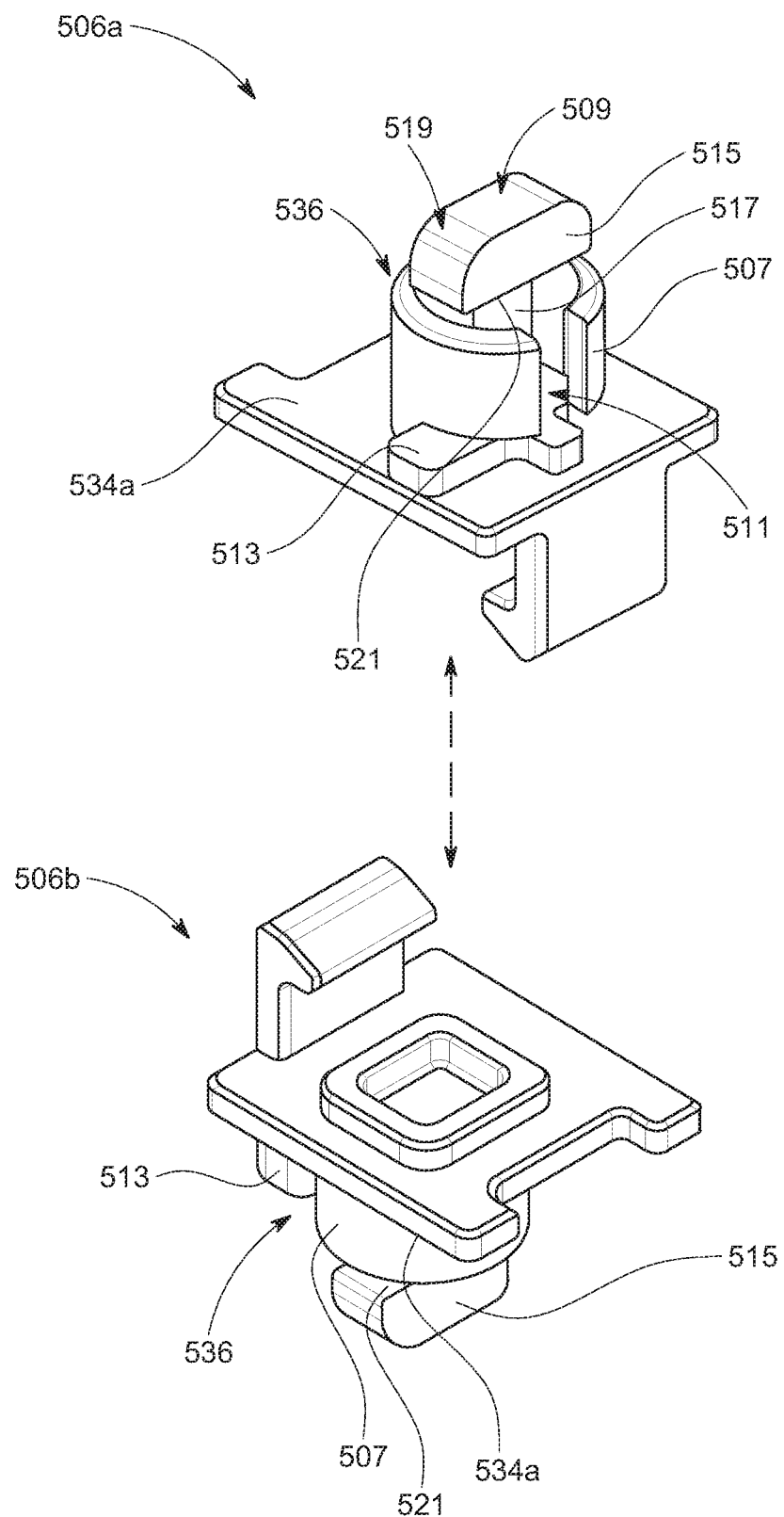
FIG. 10 is a perspective view illustrating a pair of M.2 fasteners, in accordance with yet another implementation of the present disclosure.

Referring to FIG. 10, a pair of M.2 fasteners 506a, 506b are generally similar to the pair of M.2 fasteners 306a, 306b disclosed above (shown in FIG. 5), except for having a different type of module attachment 536. Specifically, the module attachment 536 extends from a top surface 534a in the form of a hollow cylinder 507 with an inserted rotational element 509. The rotational element 509 has an inserted end 511 that is rotatably fixed within a receiving element 513. The rotational element 509 further has a latch 515 that is generally perpendicular to a rod 517 at an attachment end 519. The latch 515 secures an interface surface 521 to a respective contacting surface of the M.2 module 318, 320 (shown in FIG. 3).

Figure 11:
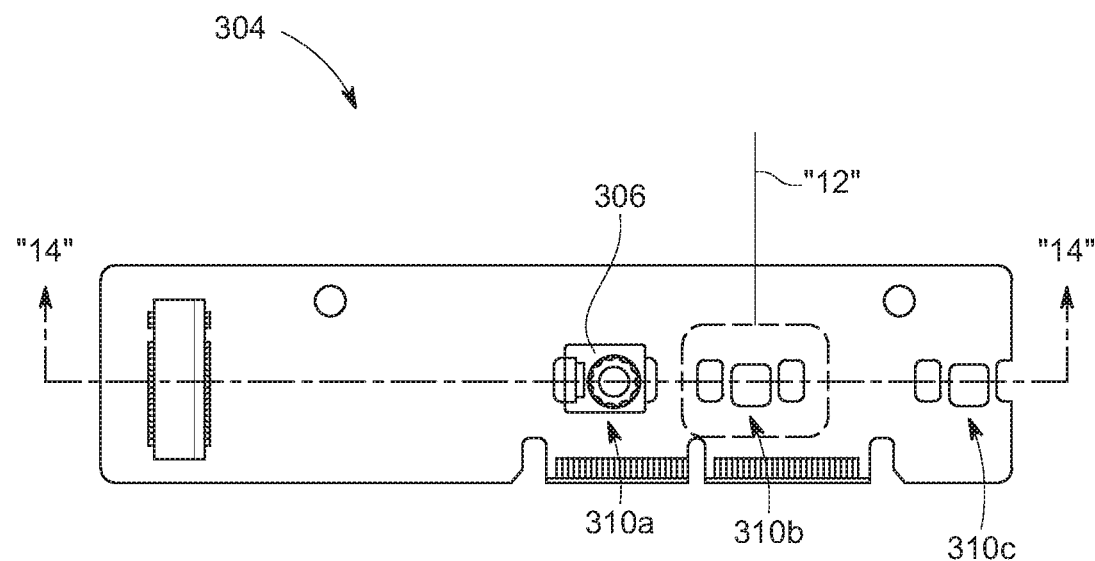
FIG. 11 is a top view illustrating the M.2 fastening system.
Figure 12:
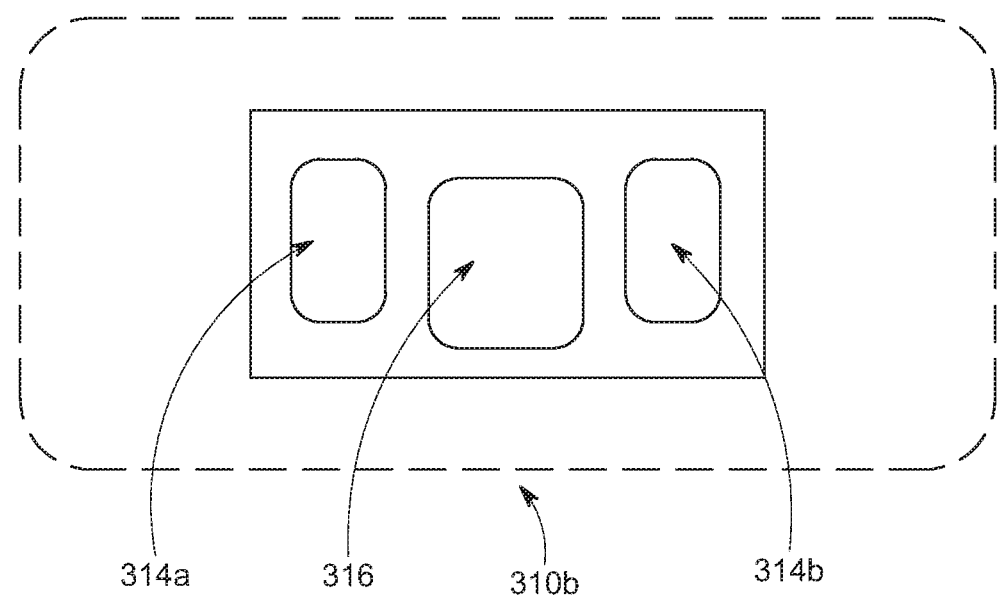
FIG. 12 is an enlarged view showing a portion of the M.2 riser card of FIG. 11.

Referring generally to FIGS. 11 and 12, the M.2 riser card 304 is configured with the pair M.2 fasteners 306 in the first position 310a, with the second and third positions 310b, 310c being available for future adjustment. Referring more specifically to FIG. 12, the second position 310b shows in an available state the first attachment aperture 314a, the second attachment aperture 314b, and the locating aperture 316. The first attachment aperture 314a is designed to receive through it the hook 344 (illustrated in FIGS. 6 and 8) of the M.2 first fastener 306a (illustrated in FIG. 5). The second attachment aperture 314b is designed to receive through it the hook 344 (illustrated in FIGS. 6 and 8) of the M.2 second fastener 306b (illustrated in FIG. 5). The locating aperture 316 is designed to receive within the locating ridge 346 (illustrated in FIG. 6).

Figure 13:
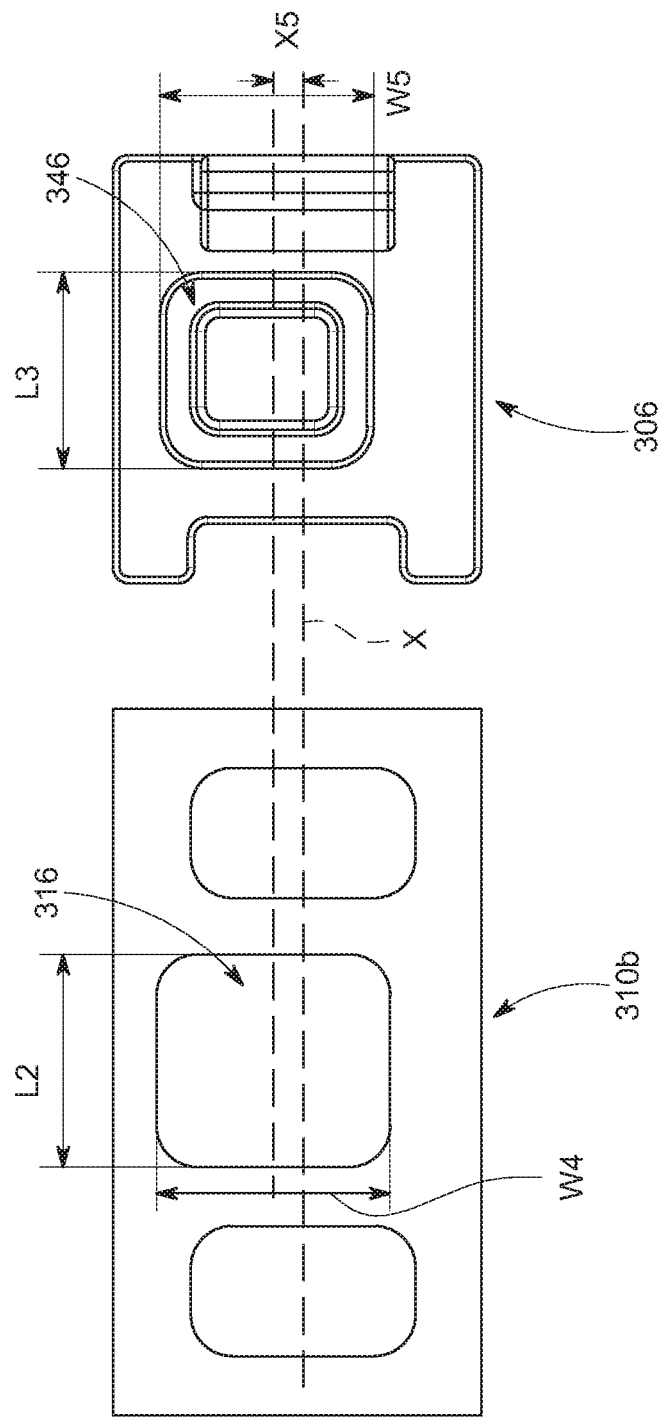
FIG. 13 shows the enlarged view of FIG. 12 with a complementary M.2 fastener, in accordance with an exemplary representation of the present disclosure.

Referring to FIG. 13, the second position 310b is illustrated relative to one of the M.2 fasteners 306. According to this exemplary representation, the locating aperture 316 has a width W4 of approximately 5.7 mm and a length L2 of approximately 5.2 mm. These dimensions are configured to receive within the locating aperture 316 an appropriately-dimensioned locating ridge 346. For example, the locating ridge 346 has a width W5 of approximately 5.5 mm and a length L3 of approximately 5.0 mm. Additionally, and optionally, the center line of the locating aperture 316 and locating ridge 346 is offset from the central X-axis by a distance X5. According to one example, the distance X5 is approximately 0.75 mm.

Figure 14:
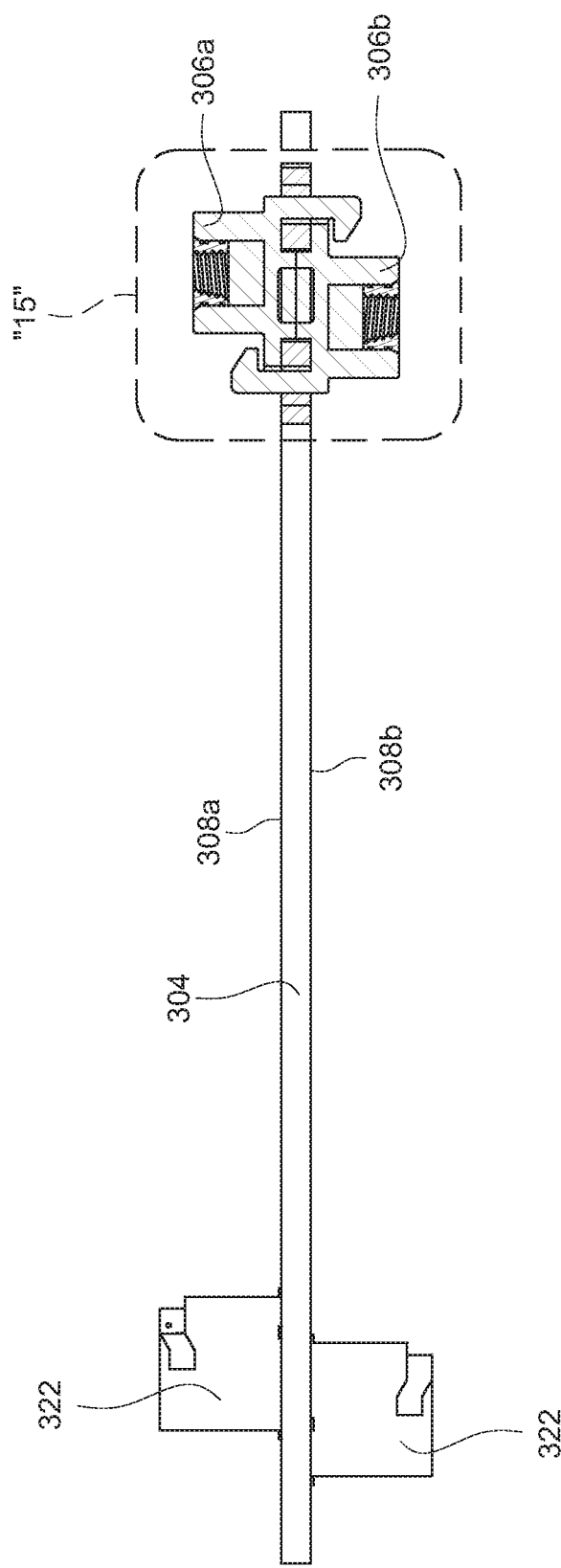
FIG. 14 is a cross-sectional view along lines "14"-"14" of FIG. 11.

Referring initially, and generally, to FIG. 14, the M.2 riser card 304 has two module interfaces 322 mounted on respective sides of the M.2 module-receiving sides 308a, 308b. Additionally, the M.2 riser card 304 further has the pair of M.2 fasteners 306a, 306b also mounted on respective sides of the M.2 module-receiving sides 308a, 308b.

Figure 15:
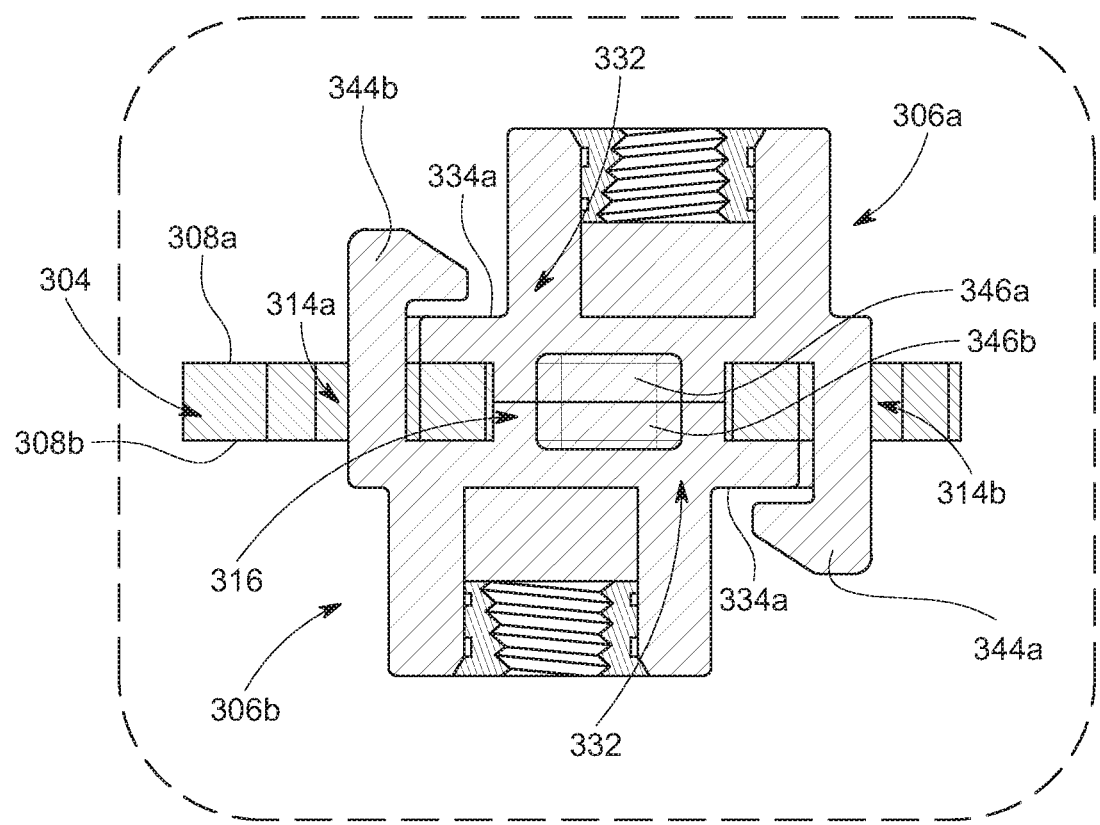
FIG. 15 is an enlarged view showing a portion with mounted M.2 fasteners of FIG. 14.

Referring more specifically now to FIG. 15, the pair of M.2 fasteners 306a, 306b are mounted a tool-less manner such that the M.2 riser card 304 is secured between the M.2 first fastener 306a and the M.2 second fastener 306b. For ease of understanding, the hook of the M.2 first fastener 306a is identified here as the first hook 344a, and the hook of the M.2 second fastener 306b is identified here as the second hook 344b. The first hook 344a is inserted and received through the second attachment aperture 314b. The first hook 344a is fastened over the top surface 334a of the main body 332 of the M.2 second fastener 306b to secure (at least in part) the M.2 riser card 304 to the M.2 first fastener 306a.

The second hook 344b is inserted and received through the first attachment aperture 314a. The second hook 344b is fastened over the top surface 334a of the main body 332 of the M.2 first fastener 306a to secure (at least in part) the M.2 riser card 304 to the M.2 second fastener 306b. According to one example, one or both of the first and second hooks 344a, 344b are fastened by pressed-fit over the respective top surface 334a.

For ease of understanding, the locating ridge of the M.2 first fastener 306a is identified here as the first locating ridge 346a, and the locating ridge of the M.2 second fastener 306b is identified here as the second locating ridge 346b. In the illustrated mounting position, the first locating ridge 346a is inserted and received through the locating aperture 316 from the first module-receiving side 308a. Further, in the illustrated mounting position, the second locating ridge 346b is inserted and received through the locating aperture 316 from the second module-receiving side 308b.

Figure 16:
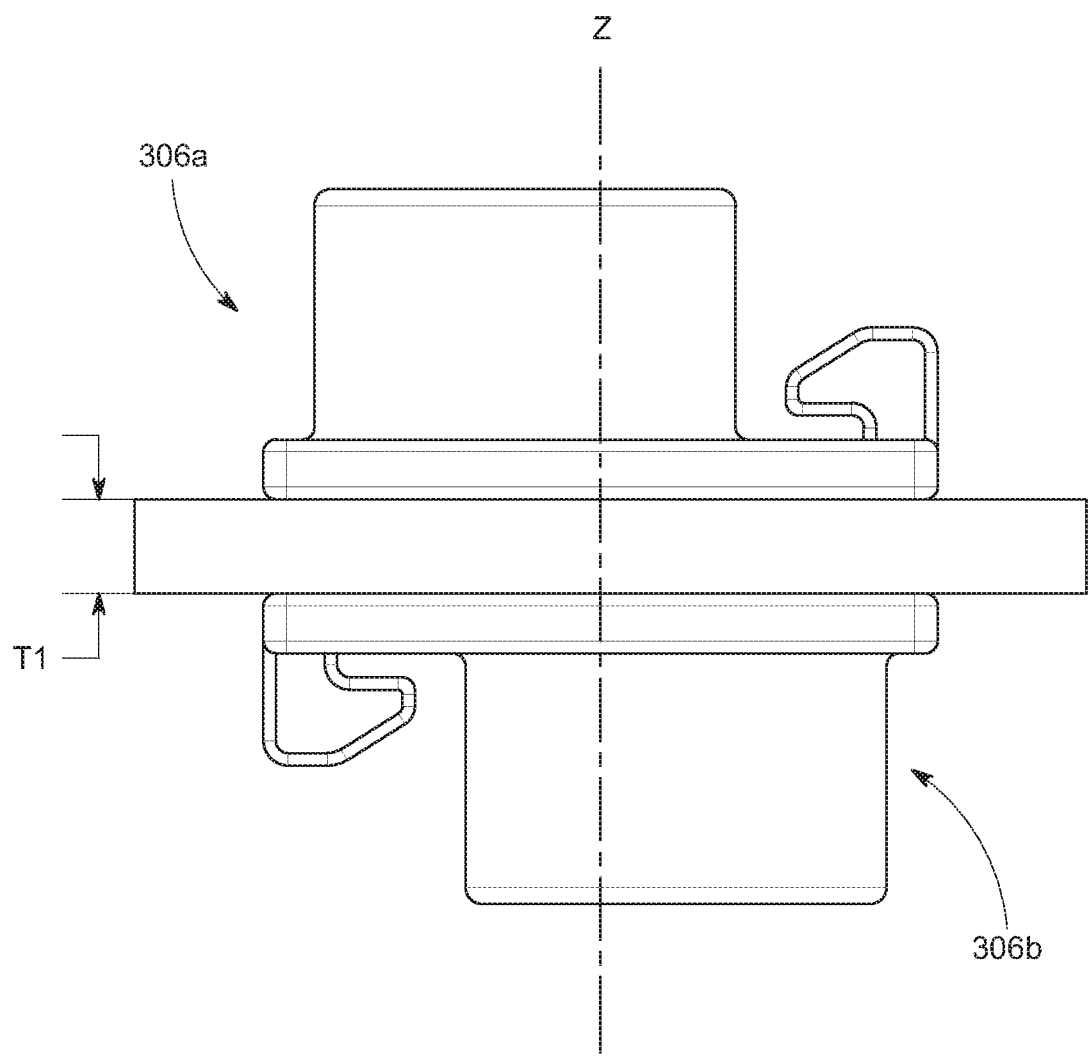
FIG. 16 is a side view showing a pair of M.2 fasteners mounted to an M.2 riser card, in accordance with another exemplary representation of the present disclosure.

Referring to FIG. 16, the pair of M.2 fasteners 306a, 306b are mounted to and secure therebetween the M.2 riser card 304 (shown in FIG. 15). In accordance with one example, the M.2 riser card 304 has a thickness T1 of approximately 1.6 mm, as measure along the Z-axis.

Figure 17:
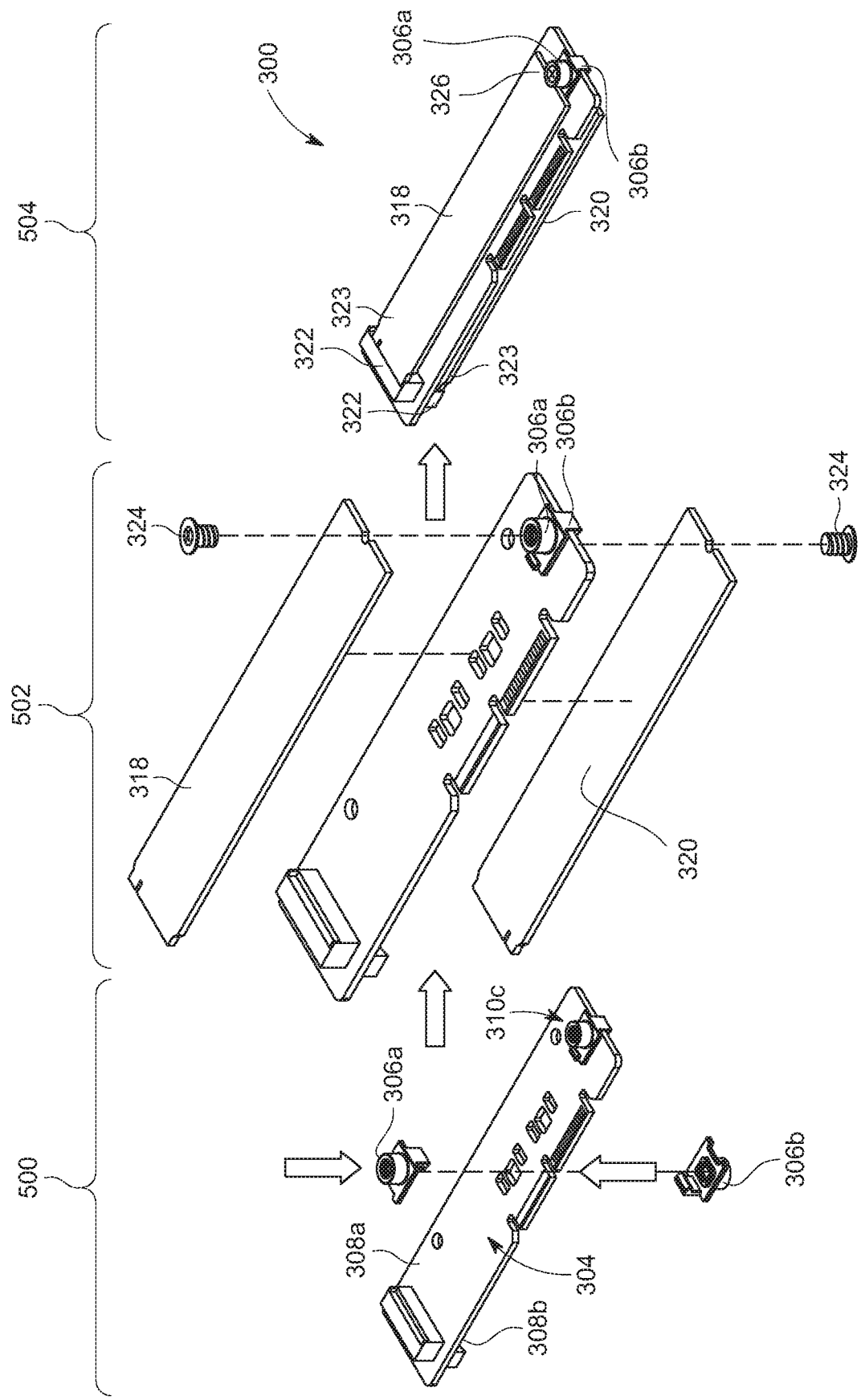
FIG. 17 illustrates assembling of the M.2 assembly of FIG. 3.

Referring to FIG. 17, the M.2 assembly 300 is assembled in a few sequential steps. Initially, in a first step 500, the M.2 fasteners 306a, 306b are mounted to the M.2 riser card 304 on respective module-receiving sides 308a, 308b. In this example, the M.2 fasteners 306a, 306b are mounted in a tool-less manner to the third position 310c. Then, in a second step 502, the M.2 modules 318, 320 are mounted respectively to the M.2 fasteners 306a, 306b with respective riser screws 324. As a result, at step 504, each M.2 module 318, 320 is mounted at the distal end 323 to a respective module interface 322, and at the proximal end 326 to a respective M.2 fastener 306a, 306b.

Figure 18:
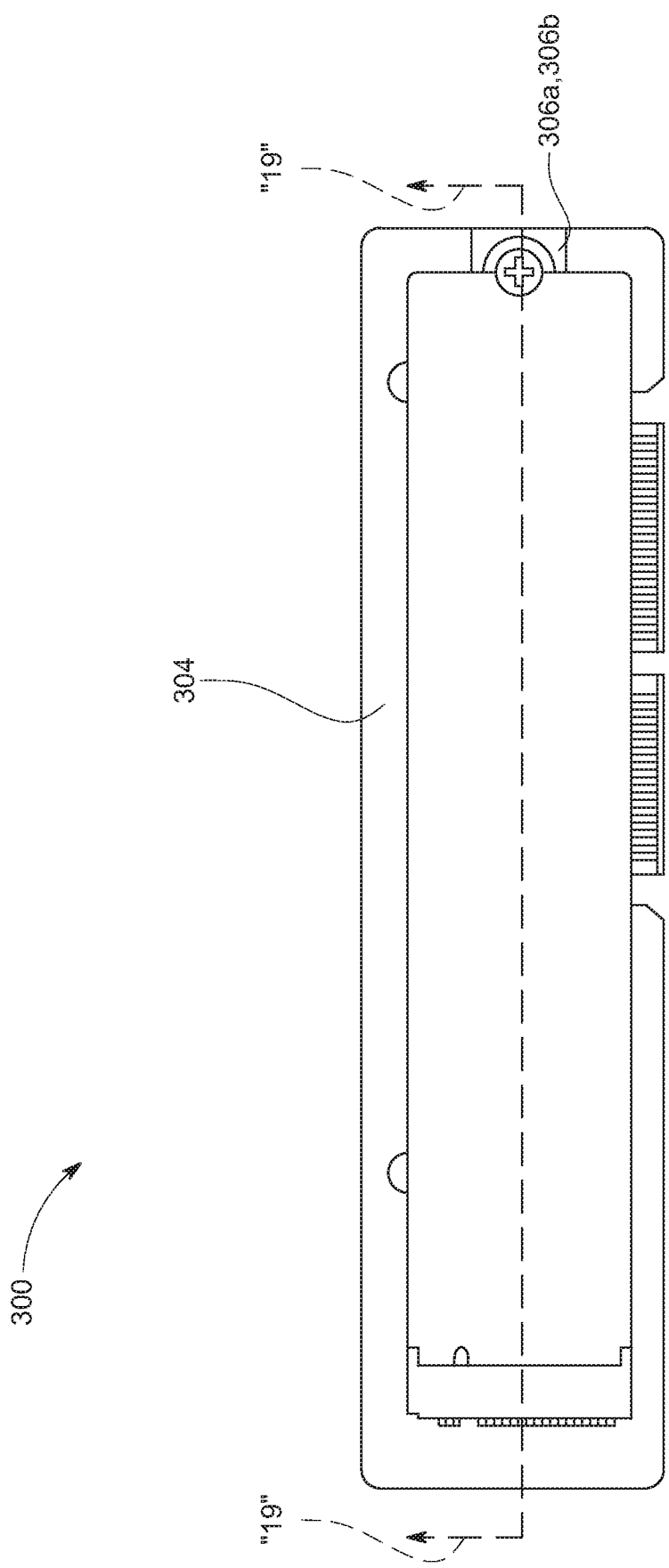
FIG. 18 is a top view of the M.2 assembly.
Figure 19:
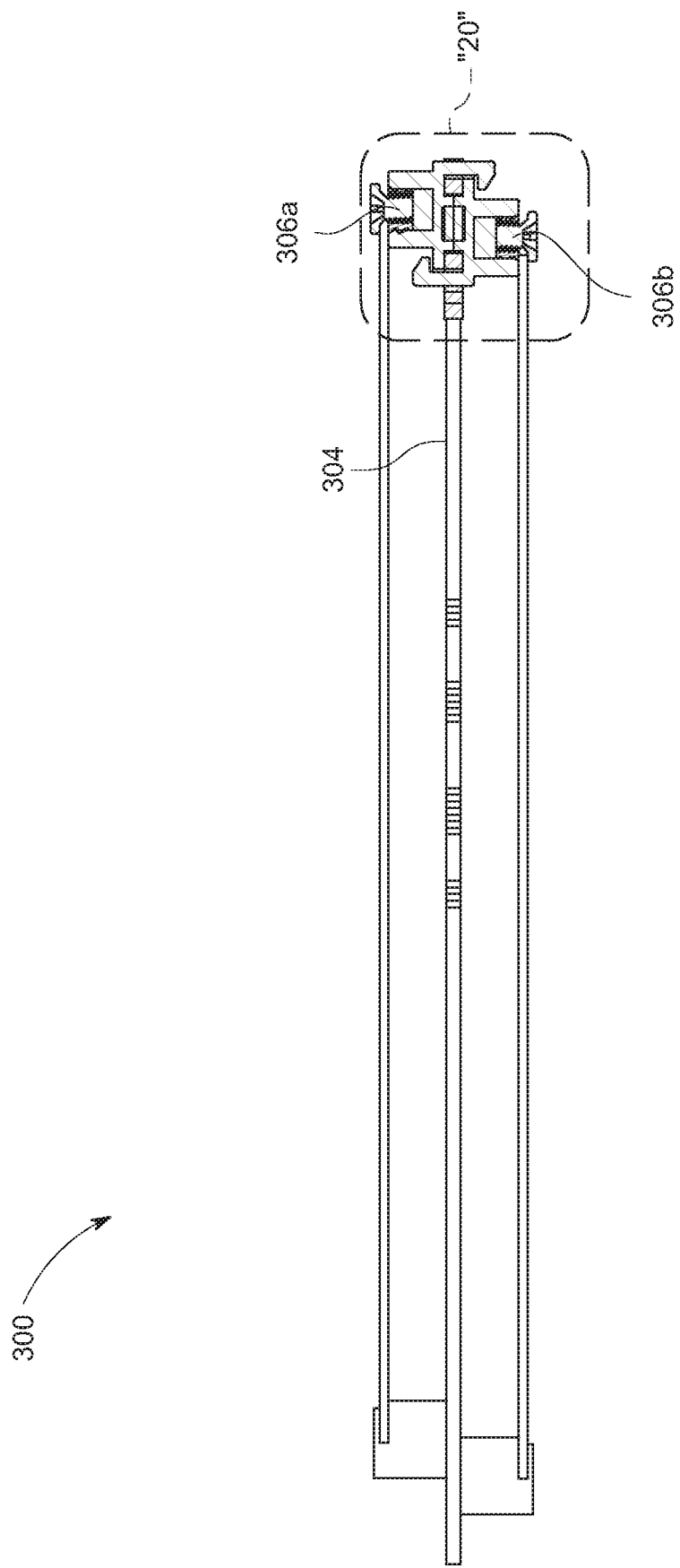
FIG. 19 is a cross-sectional side view along lines "19"-"19" of FIG. 18.
Figure 20:
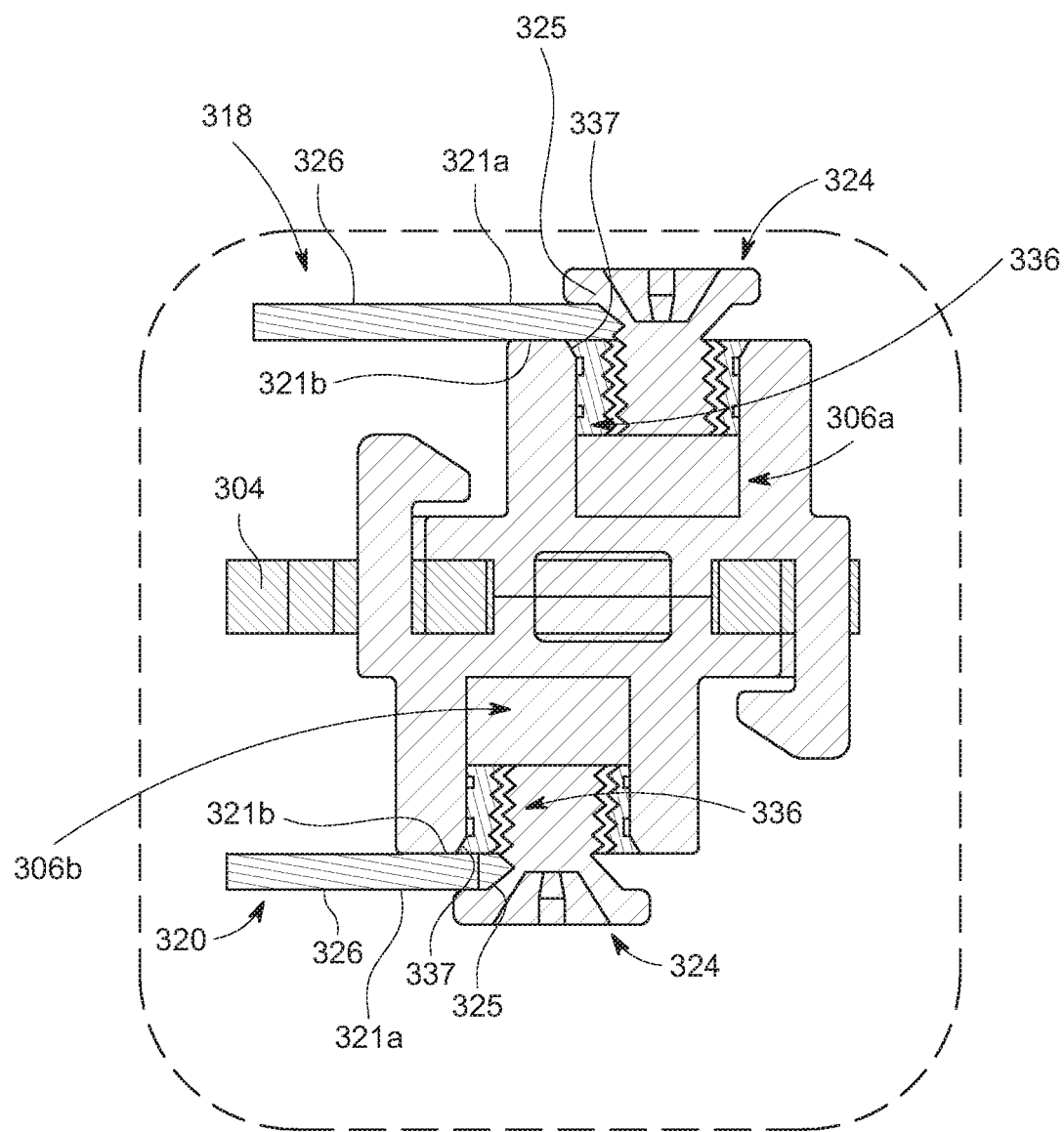
FIG. 20 is an enlarged view showing the mounted M.2 fasteners of FIG. 19.

Referring generally to FIGS. 18-20, the M.2 assembly 300 (illustrated in FIGS. 18 and 19) is illustrated completely assembled, as a double-sided design configuration that does not require any tools for mounting the M.2 fasteners 306a, 306b to the M.2 riser card 304. Referring more specifically to FIG. 20, each proximal end 326 of the M.2 modules 318, 320 has a top surface 321a that is in contact with a lower surface 325 of the respective riser screw 324. Each proximal end 326 of the M.2 modules 318, 320 further has a bottom surface 321b that is in contact with a top surface 337 of the respective module attachment 336. Thus, the proximal end 326 of the M.2 modules 318, 320 is secured between the respective riser screw 324 and the respective M.2 fastener 306a, 306b.

Figure 21:
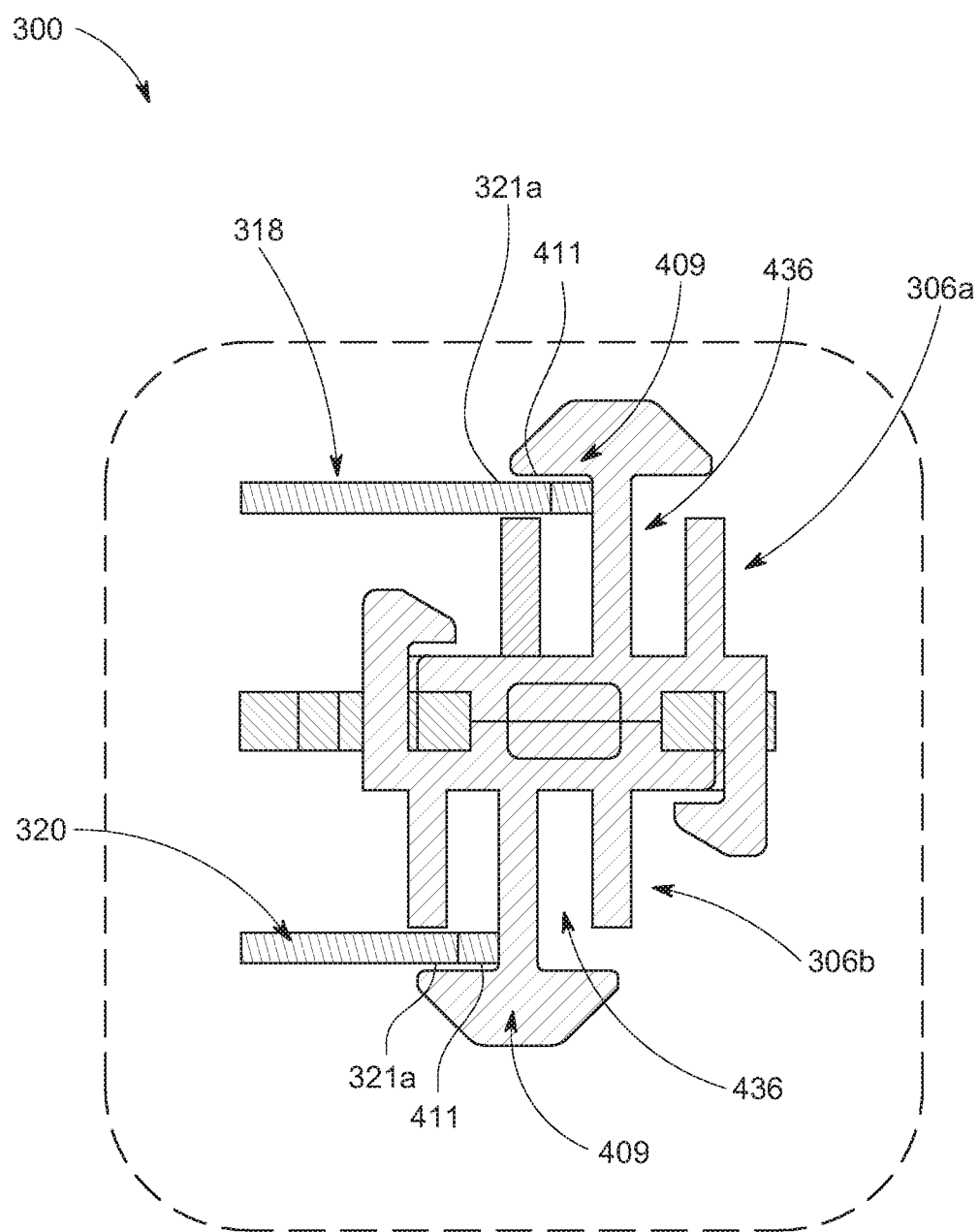
FIG. 21 is a side view representation that illustrates the M.2 assembly with M.2 fasteners having a disk-shaped end.

Referring to FIG. 21, the M.2 assembly 300 is mounted with M.2 fasteners 306a, 306b having an alternative (disk-shaped) module attachment 436, which is also illustrated in FIG. 9 and is described in more detail above. In this type of assembly, the interface surface 411 makes contact with the respective top surface 321a of the M.2 modules 318, 320. Thus, instead of the riser screws 324 disclosed above and illustrated in FIG. 20, the M.2 modules 318, 320 are secured in place with the disk-shaped end 409 of this alternative module attachment 436.

Figure 22:
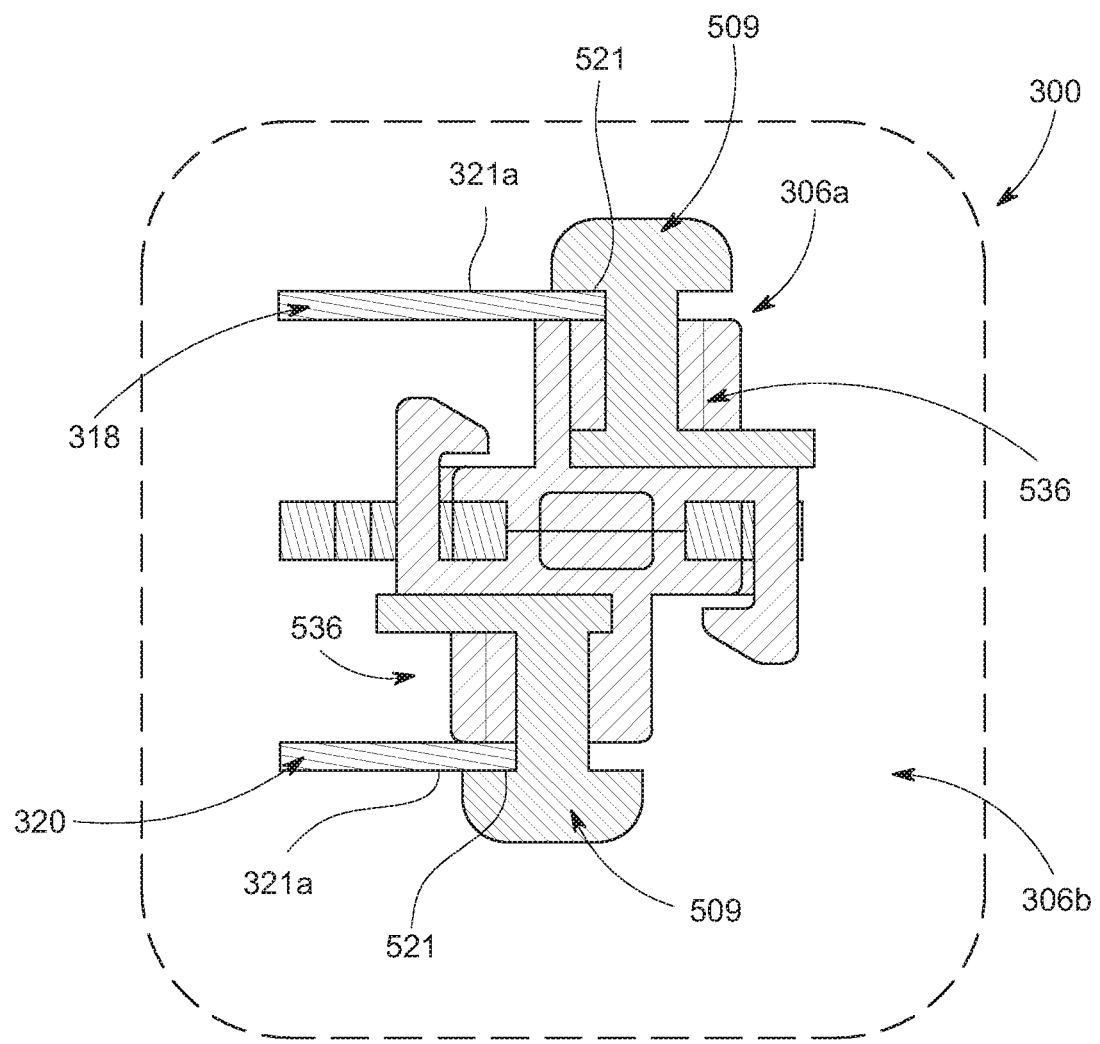
FIG. 22 is a side view representation that illustrates the M.2 assembly with M.2 fasteners having a rotational element.

Referring to FIG. 22, the M.2 assembly 300 is mounted with M.2 fasteners 306a, 306b having another alternative (rotational) module attachment 536, which is also illustrated in FIG. 10 and is described in more detail above. In this type of assembly, the interface surface 521 makes contact with the respective top surface 321a of the M.2 modules 318, 320. Thus, instead of the riser screws 324 disclosed above and illustrated in FIG. 20, the M.2 modules 318, 320 are secured in place with the rotational element 509 of this alternative module attachment 436.

Figure 23:
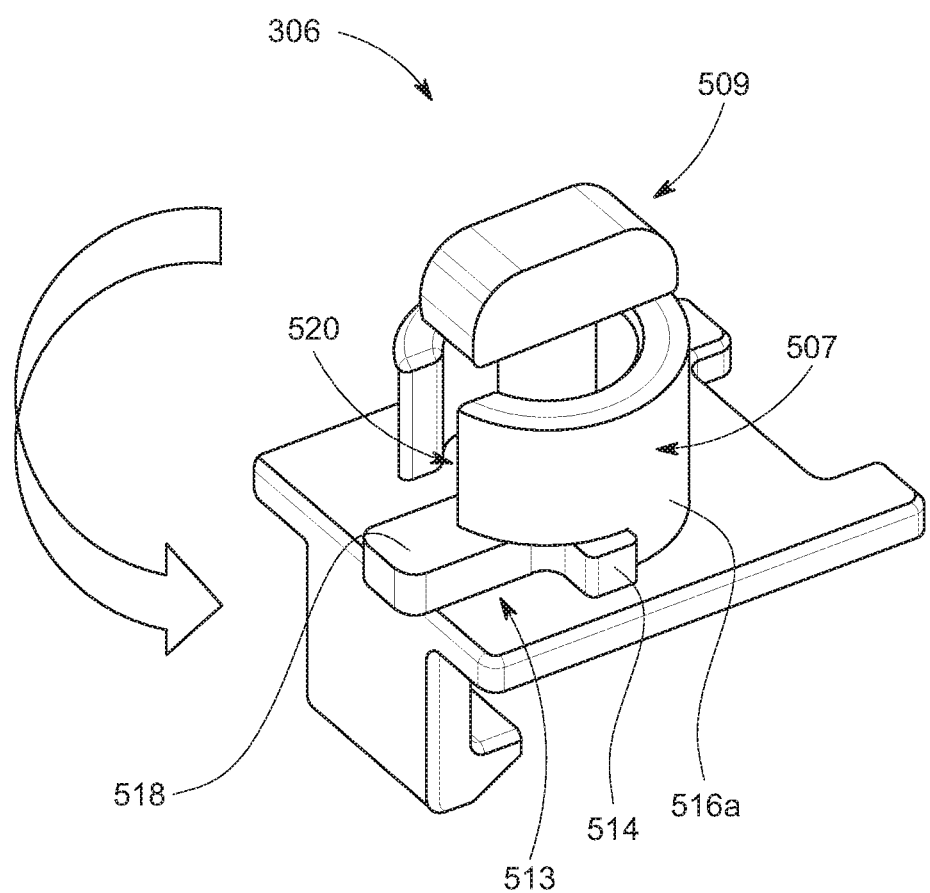
FIG. 23 is a perspective view illustrating a first rotational position of the rotational element illustrated in FIG. 22.
Figure 24:
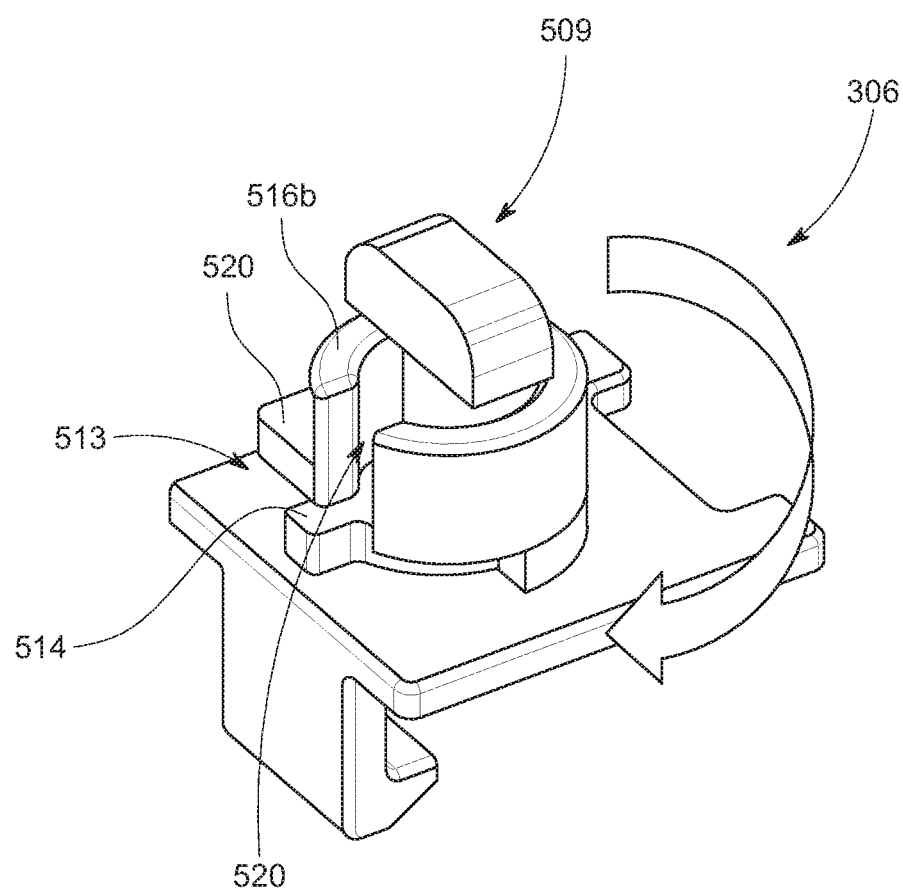
FIG. 24 is a perspective view illustrating a second rotational position of the rotational element illustrated in FIG. 22.

Referring generally to FIGS. 23 and 24, the rotational element 509 of an M.2 fastener 306 is illustrated in two rotational positions of a plurality of rotational positions. Referring more specifically to FIG. 23, the rotational element 509 is in a first rotational position, which is a locked position. When rotating between positions, the rotational element 509 rotates along with the receiving element 513. A short tab 514 is in contact with a first side 516a of the hollow cylinder 507 in the locked position. A long tab 518 is generally aligned with an opening 520 of the hollow cylinder 507 in the locked position. Referring more specifically to FIG. 24, the rotational element 509 is in a second rotational position, which is an un-locked position. In this un-locked position, the short tab 514 is generally aligned with the opening 520, and the long tab 518 is now in contact with a second side 516*b* (located opposite to and symmetrical with the first side 516*a*) of the hollow cylinder 507.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An M.2 fastening system for mounting an M.2 module to a printed circuit board (PCB), the M.2 fastening system comprising:
    an M.2 riser card having an M.2 first module-receiving side and an M.2 second module-receiving side, the M.2 riser card further having a plurality of adjustment positions positioned at respective distances from a distal end, each of the plurality of adjustment positions including a first attachment aperture and a second attachment aperture; and
    a pair of M.2 fasteners including an M.2 first fastener and an M.2 second fastener, the M.2 first fastener being mounted on the M.2 first module-receiving side, the M.2 second fastener being mounted on the M.2 second module-receiving side, each of the pair of M.2 fasteners having
        a main body defined by a top surface and a bottom surface;
        a module attachment extending from the top surface for fixing the M.2 module to the M.2 riser card; and
        a hook extending from the bottom surface along a lateral side of the main body;
    wherein the hook of the M.2 first fastener is received through the first attachment aperture, the hook of the M.2 first fastener being pressed-fit over the top surface of the main body of the M.2 second fastener, the hook of the M.2 first fastener securing in a tool-less manner the M.2 riser card between the M.2 first fastener and the M.2 second fastener.

2. The M.2 fastening system of claim 1, wherein the hook of the M.2 second fastener is received through the second attachment aperture, the hook of the M.2 second fastener being pressed-fit over the top surface of the main body of the M.2 first fastener, the hook of the M.2 second fastener further securing the M.2 first fastener and the M.2 second fastener to each other and to the M.2 riser card.

3. The M.2 fastening system of claim 1, wherein each of the pair of M.2 fasteners further has a locating ridge extending from the bottom surface of the main body.

4. The M.2 fastening system of claim 3, wherein each of the plurality of adjustment positions further includes a locating aperture positioned between the first attachment aperture and the second attachment aperture, the locating ridge being received within the locating aperture.

5. The M.2 fastening system of claim 4, wherein the locating ridge has a mating size and a mating shape to the locating aperture.

6. The M.2 fastening system of claim 1, wherein the module attachment has a cylindrical shape.

7. The M.2 fastening system of claim 1, wherein the module attachment has an internal threaded nut for receiving a screw, the internal threaded nut securing, with the screw, the M.2 module to the M.2 riser card.

8. The M.2 fastening system of claim 1, wherein the module attachment extends in the form of a support rib with a disk-shaped end, the disk-shaped end securing the M.2 module to the M.2 riser card with a press-fit connection.

9. The M.2 fastening system of claim 1, wherein the module attachment includes a hollow cylinder and a rotational element, the rotational element having a rod with an inserted end rotatably fixed within the hollow cylinder, the rotational element further having a latch generally perpendicular to the rod at an attachment end, the latch securing the M.2 module to the M.2 riser card.

10. The M.2 fastening system of claim 1, wherein at least one of the pair of M.2 fasteners consists of a plastic material.

11. The M.2 fastening system of claim 1, wherein the M.2 first fastener is identical to the M.2 second fastener.

12. The M.2 fastening system of claim 1, wherein the plurality of adjustment positions includes a first position, a second position, and a third position.

13. The M.2 fastening system of claim 12, wherein the first position is at a distance of approximately 60 millimeters (mm) from the distal end, the second position is at a distance of approximately 80 millimeters (mm) from the distal end, and the third position is at a distance of approximately 110 millimeters (mm) from the distal end.

14. A method of assembly for an M.2 fastening system, the method comprising:
    providing an M.2 riser card having an M.2 first module-receiving side and an M.2 second module-receiving side, the M.2 riser card further having a plurality of adjustment positions positioned at respective distances from a distal end, each of the plurality of adjustment positions including a first attachment aperture and a second attachment aperture, the plurality of adjustment positions including at least a first adjustment position and a second adjustment position;

positioning an M.2 first fastener on the M.2 first module-receiving side, the M.2 first fastener having a first hook inserted through the first attachment aperture of the first adjustment position, the M.2 first fastener having a first main body with a first bottom surface in contact with the M.2 first module-receiving side;

positioning an M.2 second fastener on the M.2 second module-receiving side, the M.2 second fastener having a second hook inserted through the second attachment aperture of the first adjustment position, the M.2 second fastener having a second main body with a second bottom surface in contact with the M.2 second module-receiving side; and securing via a press-fit, tool-less, connection the first hook to the second main body and the second hook to the first main body, the securing mounting the M.2 riser card between the M.2 first fastener and the M.2 second fastener.

15. The method of claim 14, further comprising:

mounting an M.2 first module to a first module attachment of the M.2 first fastener, the first module attachment extending from a first top surface of the first main body; and mounting an M.2 second module to a second module attachment of the M.2 second fastener, the second module attachment extending from a second top surface of the second main body.

16. The method of claim 15, wherein the mounting of the M.2 first module and the M.2 second module is achieved via a (a) nut connection, (b) a press-fit connection, or (c) a rotational latch connection.

17. The method of claim 14, further comprising moving the M.2 first fastener and the M.2 second fastener to the second adjustment position.

18. An M.2 fastening system for mounting an M.2 module to a printed circuit board (PCB), the M.2 fastening system comprising:

an M.2 riser card having an M.2 first module-receiving side and an M.2 second module-receiving side, the M.2 riser card further having a first attachment aperture and a second attachment aperture;

an M.2 first fastener mounted on the M.2 first module-receiving side and having
 a first main body defined by a first top surface and a first bottom surface,
 a first module attachment extending from the first top surface, and
 a first hook extending from the first bottom surface along a first lateral side of the first main body, the first hook being received through the first attachment aperture; and an M.2 second fastener mounted on the M.2 second module-receiving side and having
 a second main body defined by a second top surface and a second bottom surface, the first hook being pressed-fit, in a tool-less manner, over the second top surface,
 a second module attachment extending from the second top surface, and
 a second hook extending from the second bottom surface along a second lateral side of the second main body, the second hook being received through the second attachment aperture, the second hook being pressed-fit, in a tool-less manner, over the first top surface.

19. The M.2 fastening system of claim 18, wherein the M.2 first fastener and the M.2 second fastener are identical to each other.

20. The M.2 fastening system of claim 18, wherein at least one of the first module attachment and the second module attachment includes a (a) nut connection, (b) a press-fit connection, or (c) a rotational latch connection.

\* \* \* \* \*